(12) United States Patent
Hayashi

(10) Patent No.: US 7,898,165 B2
(45) Date of Patent: Mar. 1, 2011

(54) LIGHT-EMITTING DEVICE AND ELECTRONIC APPARATUS

(75) Inventor: Kenji Hayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/769,296

(22) Filed: Apr. 28, 2010

(65) Prior Publication Data

US 2010/0207519 A1  Aug. 19, 2010

Related U.S. Application Data

(63) Continuation of application No. 11/470,483, filed on Sep. 6, 2006, now Pat. No. 7,741,769.

(30) Foreign Application Priority Data

Nov. 22, 2005  (JP) .................... 2005-336651

(51) Int. Cl.
H01J 1/62 (2006.01)
(52) U.S. Cl. .................... 313/498; 313/512
(58) Field of Classification Search .......... 445/23–25; 313/498–512
See application file for complete search history.

(56) References Cited

U.S. PATENT DOCUMENTS

| 6,781,746 | B2 | 8/2004 | Yamazaki et al. |
| 6,872,473 | B2 | 3/2005 | Song et al. |
| 7,038,836 | B2 | 5/2006 | Yamazaki et al. |
| 7,462,384 | B2 | 12/2008 | Yamazaki et al. |
| 7,612,498 | B2 | 11/2009 | Sano et al. |
| 2003/0017297 | A1 | 1/2003 | Song et al. |
| 2004/0212759 | A1 | 10/2004 | Hayashi |
| 2004/0232832 | A1 | 11/2004 | Kubota |
| 2005/0218796 | A1 | 10/2005 | Kubota |
| 2006/0275540 | A1 | 12/2006 | Kubota |

FOREIGN PATENT DOCUMENTS

| JP | A 9-185994 | 7/1997 |
| JP | A 2000-223264 | 8/2000 |
| JP | A 2001-284041 | 10/2001 |
| JP | A-2001-345174 | 12/2001 |
| JP | A 2003-17244 | 1/2003 |
| JP | A-2003-323974 | 11/2003 |
| JP | A-2004-127606 | 4/2004 |
| JP | A-2004-281247 | 10/2004 |
| JP | A-2004-342515 | 12/2004 |

(Continued)

Primary Examiner — Joseph L Williams
(74) Attorney, Agent, or Firm — Oliff & Berridge, PLC

(57) ABSTRACT

A light-emitting device includes: a substrate; a plurality of light-emitting elements which is formed on the substrate and each of which has an anode partitioned by an insulating pixel partition wall, a cathode, and an organic light-emitting layer interposed therebetween and emits light by an electric field generated by the anode and the cathode; a first organic buffer layer that is formed by applying an organic compound and hardening the organic compound and covers a region larger than the region in which the plurality of light-emitting elements are formed; a second organic buffer layer that is that is formed by applying an organic compound and hardening the organic compound and is arranged above the substrate with the first organic buffer layer interposed therebetween so as to cover the plurality of light-emitting elements; and a gas barrier layer that is formed of an inorganic compound, covers a region larger than the region in which the first and second organic buffer layers are formed, and protects the plurality of light-emitting elements from air. In the light-emitting device, a region of the substrate overlapping the first organic buffer layer is not completely matched with a region of the substrate overlapping the second organic buffer layer.

5 Claims, 9 Drawing Sheets

FOREIGN PATENT DOCUMENTS

| | | |
|---|---|---|
| JP | A 2005-100943 | 4/2005 |
| JP | A-2005-157141 | 6/2005 |
| JP | A-2005-353398 | 12/2005 |
| JP | A-2006-004650 | 1/2006 |
| JP | A 2006-24421 | 1/2006 |
| KR | 2003-0008818 | 1/2003 |
| KR | 10-2004-0073695 | 8/2004 |
| KR | 10-2004-0098030 | 11/2004 |

LIGHT-EMITTING DEVICE AND ELECTRONIC APPARATUS

This is a Continuation of application Ser. No. 11/470,483 filed Sep. 6, 2006. This application also claims priority to Japanese Patent Application No. 2005-336651, filed Nov. 22, 2005. The disclosure of the prior applications is hereby incorporated by reference herein in its entirety.

BACKGROUND

1. Technical Field

The present invention relates to a technique for sealing a thin film of a light-emitting element.

2. Related Art

As one type of light-emitting elements, there is an organic EL (electroluminescent) element that has a multilayered structure of two electrodes and a thin organic light-emitting film, formed of an organic compound, interposed between the two electrodes and emits light by excitation due to an electric field generated between the two electrodes. A sealing process is performed to prevent an organic light-emitting material and a cathode, which includes an electron injection layer formed of, for example, calcium, magnesium, or aluminum complex, from deteriorating. As sealing techniques, a thin-film sealing technique for covering organic EL elements with an excessively thin inorganic compound film has been known (see JP-A-9-185994, JP-A-2001-284041, JP-A-2000-223264, and JP-A-2003-17244). In these techniques, the inorganic compound film serves as a gas barrier layer that prevents the infiltration of air.

In the thin-film sealing technique, in order to cover the organic EL elements, a planarizing layer formed of an organic compound, such as an organic buffer layer, is formed on the surfaces of cathodes of a plurality of light-emitting elements and on pixel partitions to planarize uneven portions formed by the cathodes and the pixel partitions, and then a gas barrier layer formed of an inorganic compound is formed thereon. However, in the gas barrier layer having the above-mentioned structure, stress concentrates on the edge of the organic buffer layer (a rising portion of the organic buffer layer). When remarkable stress concentration occurs, the gas barrier layer may be cracked or peeled off. Further, when a gas barrier layer is formed of an inorganic compound, such as silicon compound having transmittance and high moisture-resistance, the inorganic compound layer has density and elastic modulus (Young's modulus) higher than those of an organic compound layer. Accordingly, a crack may occur due to the stress concentration.

If the gas barrier layer cracks or is peeled off, moisture contained in atmospheric air is infiltrated into the organic EL elements, which causes the sealing property (in particular, coatability for minute foreign materials not purified by a clean room) of the organic EL elements to significantly deteriorate. This causes early deterioration of the organic EL elements, which will be necessarily solved. When a gas barrier film is composed of an organic compound film having low elasticity to prevent the stress concentration, or when the gas barrier layer is formed with a constant thickness to prevent the stress concentration, the gas barrier layer is not cracked or peeled off, but a sufficient sealing property is not obtained, which will cause early deterioration of the organic EL elements.

SUMMARY

An advantage of some aspects of the invention is that it provides a light-emitting device capable of sufficiently sealing light-emitting elements with a gas barrier layer that is prevented from being cracked or peeled off and an electronic apparatus including the light-emitting device.

According to an aspect of the invention, a light-emitting device includes: a substrate; a plurality of light-emitting elements which is formed on the substrate and each of which has an anode partitioned by an insulating pixel partition wall, a cathode, and an organic light-emitting layer interposed therebetween and emits light by an electric field generated by the anode and the cathode; a first organic buffer layer that is formed by applying an organic compound and hardening the organic compound and covers a region larger than the region in which the plurality of light-emitting elements are formed; a second organic buffer layer that is that is formed by applying an organic compound and hardening the organic compound and is arranged above the substrate with the first organic buffer layer interposed therebetween so as to cover the plurality of light-emitting elements; and a gas barrier layer that is formed of an inorganic compound, covers a region larger than the region in which the first and second organic buffer layers are formed, and protects the plurality of light-emitting elements from air. In the light-emitting device, a region of the substrate overlapping the first organic buffer layer is not completely matched with a region of the substrate overlapping the second organic buffer layer. The organic compound is a compound having a carbon skeleton as a basic structure.

A large step difference occurs in a plurality of light-emitting elements composed of insulating pixel partitions, a large number of anodes formed in regions surrounded by the pixel partitions, and a cathode formed thereon. When a gas barrier layer formed of an inorganic compound is directly adhered to the cathode, a large step difference occurs in the gas barrier layer, and the gas barrier layer is cracked or peeled off by stress concentration. In order to prevent the gas barrier layer from being cracked or peeled off, it is effective to apply an organic compound on uneven portions, which are a plurality of light-emitting elements, and harden the organic compound to form an organic buffer layer for planarizing the surface, before the gas barrier layer is formed, as in the light-emitting device according to this aspect. A large amount of organic compound is applied to form an organic buffer layer having a sufficiently large thickness to fill up the step portion, thereby substantially planarizing the gas barrier layer. It is also possible to release stress concentration on a rising portion of the gas barrier layer. However, in order to improve the flatness of the organic buffer layer, it is necessary to apply a liquid material having high viscosity to form an organic buffer layer with a large thickness. In this case, surface tension increases, causing the angle of the edge of the organic buffer layer to excessively increase. That is, the rise angle of the gas barrier layer excessively increases, and thus a considerable amount of stress concentrates on a rising portion of the gas barrier layer.

In order to solve these problems, in the light-emitting device according to the above-mentioned aspect of the invention, the organic buffer layer has a two-layer structure, and a region in which the first organic buffer layer is formed is not completely matched with a region in which the second organic buffer layer is formed. Since the organic buffer layer has a two-layer structure, the thickness of each layer is smaller than that of the organic buffer layer having a single-layer structure. Therefore, the angle of an edge portion of each layer is smaller than that of an edge portion of the organic buffer layer having the single-layer structure. However, since the region in which the first organic buffer layer is formed is not completely matched with the region in which the second organic buffer layer, a rise angle of the gas barrier layer slightly increases in a part of or the entire rising portion of the gas barrier layer. That is, the gas barrier layer of the light-emitting device is prevented from being cracked or peeled off. Therefore, according to the light-emitting device of this aspect, it is possible to sufficiently seal the light-emitting elements with the gas barrier layer that is prevented from being cracked or peeled off.

In the light-emitting device according to this aspect, the region in which the second organic buffer layer is formed may be larger than the region in which the first organic buffer layer is formed, or the region in which the first organic buffer layer is formed may be larger than the region in which the second organic buffer layer is formed.

In the former light-emitting device, the first organic buffer layer may include a first constant portion that has a constant thickness and covers a region larger than the region in which the plurality of light-emitting elements are formed, and a first edge portion that surrounds the first constant portion and is tapered off toward the edge thereof. In addition, the second organic buffer layer may include a second constant portion that has a constant thickness and covers a region larger than the region in which the plurality of light-emitting elements are formed, and a second edge portion that surrounds the second constant portion and is tapered off toward the edge thereof. Preferably, the second constant portion and the second edge portion overlap the first constant portion, and the thickness of the first constant portion is smaller than that of the second constant portion. The term 'constant' means 'being substantially constant'. More specifically, in a case in which the height of the pixel partition is 2 μM and a step difference of a light-emitting region is 2 μm, when the thickness of the organic buffer layer above the pixel partition is about 3 μm and the thickness of the organic buffer layer in a portion in which the pixel partition is not provided (a light-emitting portion) is about 5 μm, the surface of the organic buffer layer can be said to be substantially flat. The thickness of the organic buffer layer depends on whether the pixel partition exists or not, and a substantially flat portion of the organic buffer layer is defined as a constant portion.

According to this light-emitting device, the second organic buffer layer, which is an upper layer and has a small covering region, is thicker than the first organic buffer layer, which is a lower layer and has a large covering region. Therefore, even when the total thickness of the first and second organic buffer layers sufficiently increases in order to improve the sealing property of a plurality of light-emitting elements, the rise angle of the gas barrier layer is equal to the angle of the first edge portion of the first organic buffer layer having a smaller thickness. Since the second constant portion and the second edge portion overlap the first constant portion, the gas barrier layer is sequentially arranged along the first edge portion and the second edge portion in the rising portion thereof. Therefore, even when the thickness of the second organic buffer layer, which is an upper layer and a small size, is large and the angle of the second edge portion is large, the gas barrier layer gradually rises. In this way, it is possible to sufficiently increase the total thickness of the first and second organic buffer layers covering a region in which the plurality of light-emitting elements are arranged, while slightly increasing the rise angle of the gas barrier layer. Thus, it is possible to prevent the gas barrier layer from being cracked or peeled off, and to further improve the sealing property of the light-emitting elements.

In the latter light-emitting device, the first organic buffer layer may include a first constant portion that has a constant thickness and covers a region larger than the region in which the plurality of light-emitting elements are formed, and a first edge portion that surrounds the first constant portion and is tapered off toward the edge thereof. In addition, the second organic buffer layer may include a second constant portion that has a constant thickness and covers a region larger than the region in which the plurality of light-emitting elements are formed, and a second edge portion that surrounds the second constant portion and is tapered off toward the edge thereof. Preferably, the first constant portion and the first edge portion overlap the second constant portion, and the thickness of the second constant portion is smaller than that of the first constant portion.

According to this light-emitting device, the first organic buffer layer, which is a lower layer and has a small covering region, is thicker than the second organic buffer layer, which is an upper layer and has a large covering region. Therefore, even when the total thickness of the first and second organic buffer layers sufficiently increases in order to improve the sealing property of a plurality of light-emitting elements, the rise angle of the gas barrier layer is equal to the angle of the second edge portion of the second organic buffer layer having a smaller thickness. Since the first constant portion and the first edge portion overlap the second constant portion, the gas barrier layer is sequentially arranged along the second edge portion and the first edge portion in the rising portion thereof. Therefore, even when the thickness of the first organic buffer layer, which is an upper layer and a small size, is large and the angle of the first edge portion is large, the gas barrier layer gradually rises. In this way, it is possible to sufficiently increase the total thickness of the first and second organic buffer layers covering a region in which the plurality of light-emitting elements are arranged, while slightly increasing the rise angle of the gas barrier layer. Thus, it is possible to prevent the gas barrier layer from being cracked or peeled off, and to further improve the sealing property of the light-emitting elements.

In the above-mentioned light-emitting device according to this aspect, preferably, an angle formed between an upper surface of the first organic buffer layer (or the second organic buffer layer) and an upper layer of the substrate at the edge of the first organic buffer layer (or the second organic buffer layer) is equal to or smaller than 20°. According to this structure, it is possible to sufficiently decrease the rise angle of the gas barrier layer. Therefore, it is possible to prevent stress concentration on the gas barrier layer and thus to prevent the gas barrier layer from being cracked or peeled off.

According to another aspect of the invention, an electronic apparatus includes the above-mentioned light-emitting device. In the above-mentioned light-emitting device, the light-emitting elements are reliably sealed with the gas barrier layer that is prevented from being cracked or peeled off. Therefore, according to the electronic apparatus according to this aspect, it is easy to maintain a good display quality for a long time.

BRIEF DESCRIPTION OF THE DRAWINGS

The invention will be described with reference to the accompanying drawings, wherein like numbers refer to like elements.

DETAILED DESCRIPTION OF EMBODIMENTS

Figure 1:
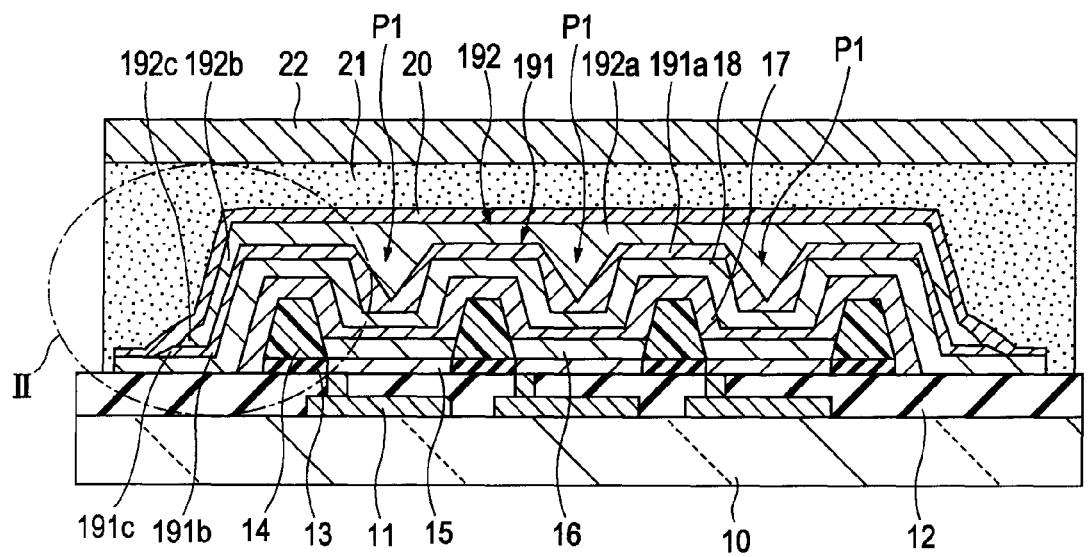
FIG. 1 is a cross-sectional view illustrating an organic EL panel according to a first embodiment of the invention.

Hereinafter, preferred embodiments of the invention will be described with reference to the accompanying drawings. In the following drawings, a scale of each member is appropriately adjusted in order to have a recognizable size. Since cross sections are shown in FIGS. 1 to 12, hatching is omitted except some parts in the drawings. In the following description, an 'upper side' and a 'lower side' are based on the plane of the drawing, and the 'thickness' of a layer means the length of the layer in the vertical direction in the cross-sectional view.

First Embodiment

Figure 2:
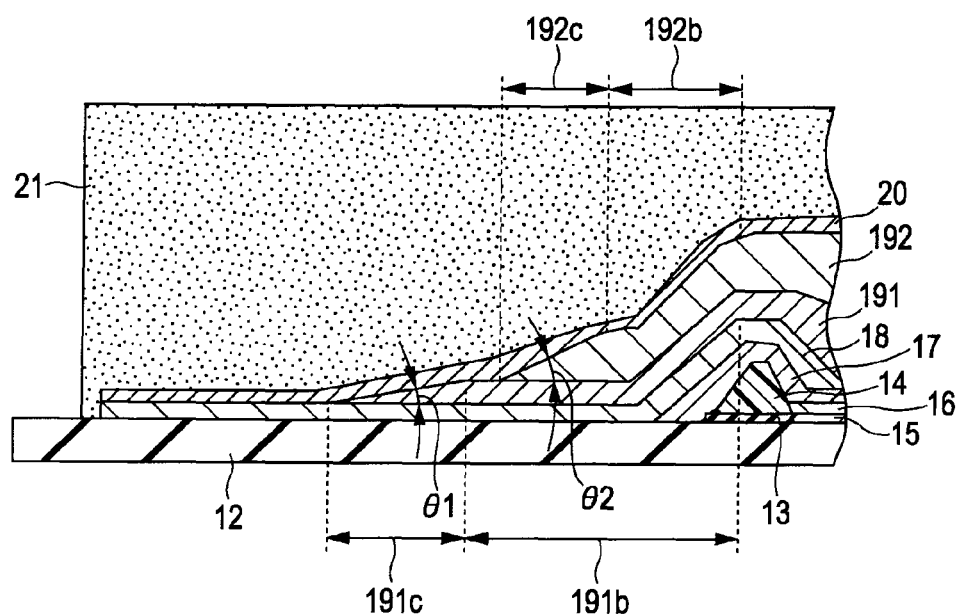
FIG. 2 is an enlarged cross-sectional view illustrating a portion A of FIG. 1.

An organic EL panel (light-emitting device) according to a first embodiment of the invention is a full color panel using a polymer organic EL material, which will be described later. The organic EL panel has an organic EL element emitting a red light component, an organic EL element emitting a green light component, and an organic EL element emitting a blue light component that are arranged side by side and is capable of performing full color display. The organic EL panel is a top emission type in which light from the organic EL element is emitted from the opposite side of a main substrate.
Structure FIG. 1 is a cross-sectional view of the organic EL panel. FIG. 2 is an enlarged cross-sectional view illustrating a portion A of the organic EL panel. The organic EL panel includes a flat main substrate 10. The main substrate 10 is formed of, for example, glass or plastic, and has a plurality of organic EL elements P1 formed on the upper surface thereof. The organic EL element P1 includes an organic light-emitting layer 16 formed of a polymer organic EL material, which will be described later, and is supplied with a current at an emitting timing to cause the organic light-emitting layer 16 (more specifically, a light-emitting layer in the organic light-emitting layer 16) to emit light. The organic EL elements P1 are divided into three types according to the colors of emission light components. These three types of organic EL elements P1 are regularly arranged on the main substrate 10.

A plurality of TFTs (thin film transistors) 11 having a one-to-one correspondence to the plurality of organic EL elements P1 and various wiring lines (only some of the wiring lines are shown in the drawings) are formed on the main substrate 10. The TFT 11 receives electric energy and control signals to drive the corresponding organic EL element P1. More specifically, the TFT 11 supplies electric energy to the corresponding organic EL element P1. An inorganic insulating layer 12 is formed on the main substrate 10 so as to cover the plurality of TFTs 11. The inorganic insulating layer 12 insulates the plurality of TFTs 11 from various wiring lines, and is formed of, for example, a silicon compound.

A lyophilic bank layer (inorganic pixel partition wall insulating layer) 13 is formed of, for example, silicon dioxide with a thickness of about 50 to 200 nm on the inorganic insulating layer 12. A lyophobic bank layer (organic pixel partition wall insulating layer) 14 is formed of, for example, acrylic resin or polyimide with a thickness of about 1 to 3 μm on the lyophilic layer 13. Concave portions are formed by the inorganic insulating layer 12, the lyophilic bank layer 13, and the lyophobic bank layer 14, and the organic EL element P1 occupies the bottom of each of the concave portions. Since a light-emitting device and an electronic apparatus using a single color does not need multi-color coating, the lyophobic bank layer 14 may not be provided, and the organic light-emitting layer 16 may be formed by, for example, a spin coating method or a slit coating method so as to be laid across an anode 15 and the lyophilic bank layer 13.

The organic EL element P1 includes the anode 15, a common cathode layer 17, and the organic light-emitting layer 16 interposed therebetween. The anode 15 and the common cathode layer 17 are electrodes for injecting holes and electrons into the organic light-emitting layer 16, and generate an electric field by means of electric energy supplied. The anode 15 is an electrode that is formed of, for example, ITO (Indium Tin Oxide) having a high hole-injecting property with a work function higher than, for example, 5 eV on the inorganic insulating layer 12. The anode 15 is connected to the corresponding TFT 11 through the wiring line. The common cathode layer 17 is formed on the organic light-emitting layer 16 and the lyophobic bank layer 14 and functions as a common electrode lying over the plurality of organic EL element P1. For example, the common cathode layer 17 includes an electron injection buffer layer for making it easy to inject electrons into the organic light-emitting layer 16 and a layer formed of a metallic material having low electric resistance, such as ITO or aluminum, on the electron injection buffer layer. The electron injection buffer layer is formed of, for example, lithium fluoride, calcium metal, or magnesium-silver alloy.

The organic light-emitting layer 16 includes a light-emitting layer that is excited by recombination of electrons and holes injected by the electric field and emits light. Alternatively, the organic light-emitting layer 16 may be formed in a multilayer structure including layers other than the light-emitting layer. In this case, it is preferable that the total thickness of all layers be smaller than 300 nm in order to reduce the electrical resistance of the layers. The layers other than the light-emitting layer include a hole injection layer for making it easy to inject holes, a hole transfer layer for making it easy to transfer the injected holes to the light-emitting layer, an electron injection layer for making it easy to inject electrons, and an electron transfer layer for making it easy to transfer the injected electrons to the light-emitting layer. These layers contribute to the recombination.

The light-emitting layer is formed of a polymer organic EL material. The polymer organic EL material is a material having a relatively high molecular weight among organic compounds that are excited by the recombination of electrons and holes and emit light. The polymer organic EL material forming the organic EL element P1 depends on the type (the color of emission light) of organic EL elements P1. A layer contributing to the recombination in the light-emitting layer is formed of a material corresponding to the material forming an adjacent layer. When these materials are diluted with a solvent and are applied in a pattern by, for example, an ink-jet method or other printing methods, the material forming the organic light-emitting layer 16 is repelled from the surface of the lyophobic bank layer 14 to cause pixels to be colored in different colors. When multi-color coating is not needed, that is, a single color is coated, the lyophobic bank layer 14 may not be provided, and the organic light-emitting layer 16 may be formed by, for example, the spin coating method or the slit coating method so as to be laid over the lyophilic bank layer 13 and the anode 15, which also enables the separation of pixels. The lyophilic bank layer 13 serves to stabilize the thickness of the organic light-emitting layer 16 up to the edge of the anode 15 provided on the bottom of the concave portion, and the organic light-emitting layer 16 is formed on the lyophilic bank layer 13. The lyophilic bank layer 13 is formed of, for example, silicon dioxide with a thickness of about 50 to 200 nm.

A cathode protecting layer 18 is formed on the inorganic insulating layer 12 and the common cathode layer 17 so as to cover the common cathode layer 17. A first organic buffer layer 191 is formed on the cathode protecting layer 18 so as to overlap all the organic EL elements P1 to planarize unevenness due to pixel partition walls. A second organic buffer layer 192 is formed on the first organic buffer layer 191 so as to overlap all the organic EL elements P1. A gas barrier layer 20 is formed on the cathode protecting layer 18, the first organic buffer layer 191, and the second organic buffer layer 192 so as to completely cover the first organic buffer layer 191 and the second organic buffer layer 192 including the edges thereof.

The gas barrier layer 20 contributes to improving the sealing of the first organic buffer layer 191, the second organic buffer layer 192, and the plurality of organic EL elements P1, and adheres closely to the first organic buffer layer 191 and the second organic buffer layer 192. The gas barrier layer 20 is formed of a material having high transmittance, gas barrier property, and water-resistance, such as a silicon compound including silicon oxynitride, silicon nitride, and SiNH. A thin film made of a high-quality inorganic compound is formed, as the gas barrier layer, at low temperature and high density by a high-density plasma deposition method, such as a CVD method, ion plating, or sputtering using ICP or ECR plasma or high-density plasma generated from a plasma gas. The thickness of the gas barrier layer 20 depends on the sealing performance of the plurality of organic EL elements P1, the possibility of a crack occurring in the gas barrier layer or the possibility of the gas barrier layer being peeled off, and manufacturing costs. More specifically, the thickness of the gas barrier layer 20 is in the range of 300 nm to 800 nm.

The first organic buffer layer 191 and the second organic buffer layer 192 are provided to improve the flatness and adhesion of the gas barrier layer 20 and to buffer stress occurring in the gas barrier layer 20. The organic buffer layers are formed as follows: an organic buffer layer material (liquid) having the following viscosity and composition is applied in the uneven portions formed by the pixel partition walls to control the thickness thereof by a screen printing method in a low pressure atmosphere; the upper surface of the second organic buffer layer is planarized by using a screen mesh and squeegee; and the organic buffer layer material is hardened. A region of the main substrate 10 overlapping the second organic buffer layer 192 is formed to have a smaller area than another region of the main substrate 10 overlapping the first organic buffer layer 191 so that it is included in another region.

The first organic buffer layer 191 preferably has a thickness of 3 µm to 10 µm, and includes a first covering portion 191a overlapping all the organic EL elements P1, a first constant portion 191b that has a constant thickness and surrounds the first covering portion 191a, and a first edge portion 191c that surrounds the first constant portion 191b and is tapered off toward the edge thereof. Since the first organic buffer layer 191 is formed by applying a liquid material, an angle θ1 formed between the upper surface of the first edge portion 191c and the upper surface of the main substrate 10 at the edge of the first organic buffer layer 191 corresponds to the thickness of the first constant portion 191b. In this embodiment, the upper limit of the thickness of the first constant portion 191b is determined such that the angle θ1 is smaller than 20°. Therefore, the upper surface of the first covering potion 191a is planarized.

Meanwhile, the thickness of the second organic buffer layer 192 is in proportion to the height of the pixel partition wall, and is preferably in the range of 3 µm to 20 µm. In addition, the second organic buffer layer 192 includes a second covering portion 192a overlapping all the organic EL elements P1, a second constant portion 192b that has a constant thickness and surrounds the second covering portion 192a, and a second edge portion 192c that surrounds the second constant portion 192b and is tapered off toward the edge thereof. The second organic buffer layer 192 is formed by applying a liquid material, and the application is performed to planarize the upper surface of the second covering portion 192a. Therefore, the thickness of the second constant portion 192b is larger than that of the first constant portion 191b, and an angle θ2 formed between the upper surface and the lower surface of the second edge portion 192c at the edge of the second organic buffer layer 192 is larger than the angle θ1. In addition, the thicknesses of the first organic buffer layer 191 and the second organic buffer layer 192 are determined, considering the coatability of the gas barrier layer with respect to a foreign matter or the ratio of light leaking from the side surface of an adhesive layer 21, which will be described later, or the side surface of a surface protecting substrate 22, which will be described later, without being incident on the upper surface of the surface protecting substrate 22.

The cathode protecting layer 18 is provided to protect the common cathode layer 17 and to improve the wettability and adhesion of the first organic buffer layer 191 before the organic buffer layer 191 is hardened. The cathode protecting layer 18 is formed of a silicon compound, such as silicon oxynitride, having high light transmittance, adhesion, and water resistance. In particular, when the common cathode layer 17 has a top emission structure, the thickness of the common cathode layer 17 is made small in consideration of transparency, which causes a lot of pinholes to be generated. Since a small amount of moisture, which is adhered while a material forming the organic buffer layer 19 is transported until the organic buffer layer 19 is formed, and the material forming the organic buffer layer 19 infiltrated into the organic light-emitting layer 16 before being hardened cause the organic light-emitting layer 16 to be damaged, and the damaged portion of the organic light-emitting layer 16 becomes a dark spot, the cathode protecting layer 18 serves to prevent the damage. Therefore, the thickness of the cathode protecting layer 18 is larger than 100 nm. In addition, on the upper surface of the common cathode layer 17, unevenness exists due to the step difference between the lyophobic bank layer 14 and the organic EL element P1, which causes stress to concentrate on the cathode protecting layer 18. In order to prevent damage due to the stress concentration, the thickness of the cathode protecting layer 18 is set to 200 nm or less.

Furthermore, the adhesive layer 21 is formed on the main substrate 10 so as to cover the inorganic insulating layer 12, the cathode protecting layer 18, and the gas barrier layer 20. The surface protecting substrate 22 is fixed to the adhesion layer 21 so as to overlap the entire surface of the adhesion layer 21. The entire lower surface of the surface protecting substrate 22 is adjacent to the adhesive layer 21. The adhesive layer 21 is provided for adhesion between the surface protecting substrate 22 and the main substrate 10 and is formed of a resin adhesive having high light transmittance. The resin adhesive includes, for example, epoxy resin, acrylic resin, urethane resin, and silicon resin. The surface protecting substrate 22 is provided to improve optical characteristics and to protect the gas barrier layer and is formed of glass or plastic having high light transmittance. The plastic includes, for example, polyethyleneterephthalate, acrylic resin, polycarbonate, and polyolefin. In addition, the surface protecting substrate 22 may have the function of a color filter, a function of blocking/absorbing ultraviolet rays, a function of preventing the reflection of external light, and a function of dissipating heat. When an optical function, such as a color filter, is not needed from the viewpoint of manufacturing costs, only the adhesive layer 21 is provided, but the surface protecting substrate may not be provided.

Manufacturing Procedure

In order to manufacture the organic EL panel according to the present embodiment, first, the TFTs 11, various wiring lines, and the inorganic insulating layer 12 are formed on the main substrate 10. Then, a reflective layer, which has a light-reflective property and is formed of, for example, an aluminum-copper alloy material, and transparent ITO are deposited on the inorganic insulating layer 12 by using a sputtering method, thereby forming the anodes 15 serving as a plurality of pixels. In this way, the anodes 15 are connected to the TFTs 11 for on/off control. Then, the lyophilic bank layer 13 is formed on the inorganic insulating layer 12 so as to surround the anodes 15. Subsequently, the lyophobic bank layer 14, which is formed of an organic compound, such as polyimide or acrylic resin, is formed on the lyophilic bank layer 13. Then, a cleaning process, such as plasma cleaning, is performed to remove organic-based contamination from the main substrate 10 and to improve the wettability of the ITO surface.

Thereafter, the organic light-emitting layer 16 is formed on the anodes 15. In this process, when a material forming the organic light-emitting layer 16 is coated, the material is flatly spread adjacent to the anode 15 and the lyophilic bank layer 13. Thus, the organic light-emitting layer 16 that is flat and has a constant thickness is formed. In a process of forming a light-emitting layer included in the organic light-emitting layer 16, a polymer-based organic EL material used to form the organic light-emitting layer 16 that emits red light is coated on the anode 15 which is to form the organic EL element P1 that emits red light. The same process as above is performed for the organic EL element P1 that emits green light and the organic EL element P1 that emit blue light. A spin coating method or a slit coating method may be used as the coating method. When three kinds of coloring materials are coated, it is preferable to perform pattern coating for each pixel by using an inkjet printing method or a screen printing method, in order to coating materials with a high degree of efficiency. When the organic light-emitting layer 16 has a plurality of layers, the plurality of layers are sequentially formed.

Then, an electrode common to the plurality of organic EL elements P1, that is, the common cathode layer 17 is formed. For example, a metallic material or an alloy into which electrons can be easily injected, such as lithium fluoride, calcium, or magnesium, is deposited by means of a vacuum deposition method using a heating boat (crucible). Then, in order to reduce the resistance of the common electrode, aluminum is deposited so as to avoid pixel units by means of the vacuum deposition method, or transparent ITO is deposited in a low pressure atmosphere by means of a high-density plasma deposition method, such as an ECR (electron cyclotron resonance) plasma sputtering method, an ion plating method, or an opposite target sputtering method. Then, an oxygen plasma process is performed, and then the cathode protecting layer 18, which is formed of silicon oxynitride, is formed so as to cover the common cathode layer 17 by means of the high-density plasma deposition method, such as the ECR plasma sputtering method or the ion plating method. Here, the oxygen plasma process is performed to improve the adhesion between the common cathode layer 17 and the cathode protecting layer 18.

Subsequently, an organic buffer layer material in a liquid state, which has a viscosity of 2000 mPa·s to 10000 mPa·s at the room temperature (25° C.), is printed on the cathode protecting layer 18 by using a screen printing method in a low pressure atmosphere, and nitrogen gas is introduced for the change to atmospheric pressure. Then, the cathode protecting layer 18 having the organic buffer layer material coated thereon is carried into a curing chamber, in which the organic buffer layer material corresponding to each substrate is heated at a temperature of 60 to 100° C. such that the organic buffer layer material is completely cured, thereby forming the first organic buffer layer 191. The reason why the process of forming the first organic buffer layer 191 is performed in the low pressure atmosphere is to remove moisture and bubbles generated during a coating process. That is, unlike in the process of forming the common cathode layer 17 or the cathode protecting layer 18, while the organic buffer layer material is coated in a relatively low vacuum condition of 100 to 5000 Pa, the moisture is removed until a dew point reaches −60° C. or less by introducing nitrogen. In addition, the reason why the organic buffer layer material having a viscosity of 2000 mPa·s or more at the room temperature is used is to avoid that the organic buffer layer material is infiltrated into the common cathode layer 17 or the organic light-emitting layer 16 through the cathode protecting layer 18.

An organic compound having high fluidity and not having a volatile component, unlike a solvent, before being hardened can be used as a main ingredient of the organic buffer layer material (for example, more than 70 weight %). In this embodiment, an epoxy monomer containing an epoxy group and having a molecular weight of 3000 or less (molecular weight of 3000 or less)/oligomer (molecular weight of 1000 to 3000) is used. Specifically, for example, any of the following materials or combinations thereof can be used: bisphenol A type epoxy oligomer or bisphenol F type epoxy oligomer, phenol novolac type epoxy oligomer, 3,4-epoxycyclohexenylmethyl-3',4'-epoxycyclohexenecarboxylate, and ε-caprolactone-modified 3,4-epoxycyclohexylmethyl-3',4'-epoxycyclohexenecarboxylate.

A hardening agent reacting with epoxy monomer/oligomer is used as a sub-ingredient of the organic buffer layer material. An agent capable of forming a hard film having high electrical insulating performance, solidity, and heat resistance is preferably used as the hardening agent. Alternatively, addition polymer having high transmittance and a small amount of variation in hardness may be used as the hardening agent. More specifically, an acid-anhydride-based hardening agent, such as 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, 3,3', 4,4'-benzophenonetetracarboxylic dianhydride, or a polymer thereof is preferably used as the hardening agent. The first reason why the acid-anhydride-based hardening agent is preferable is that the hardening of the acid-anhydride-based hardening agent is performed at a temperature of 60 to 100° C. and the hard film thereof becomes a polymer having an ester bonding having good adhesion to silicon oxynitride. The second reason is that the hardening agent can be hardened at low temperature in a short time since when a material having a relatively high molecular weight, such as aromatic amines, alcohols, or aminophenol is added thereto as a hardener for hastening a ring-opening of acid anhydride. The third region is that the hardening agent does not cause damage of each unit due to sharp hardening and shrinkage, as compared with photoinitiator of a cation emission type.

A water supplementing agent, such as a silane coupling agent or an isocyanate compound, and an additive for preventing shrinkage at the time of hardening, such as minute particles, may be dispersed as other sub-ingredients of the organic buffer layer material to improve adhesion to the common cathode layer 17 or the first gas barrier layer 20. The viscosity of the above-mentioned materials before being hardened is preferably in the range of 1000 mPa·s to 10000 mPa·s at room temperature.

The viscosity of each of the main ingredients and the sub-ingredients used in the present embodiment, before being cured, is preferably 1000 mPa·s or more at room temperature. This is to reduce a possibility that the materials before being cured will be infiltrated into the organic light-emitting layer 16. In addition, the viscosity of these materials may be determined in consideration of whether the organic buffer layer can be formed with required pattern accuracy, whether the organic buffer layer 191 can be formed with a desired thickness, and whether bubbles are not generated in the formed organic buffer layer.

Next, the second organic buffer layer 192 is formed by printing the same organic buffer layer material as described above on the first organic buffer layer 191 by a screen printing method in a low pressure atmosphere, applying pressure thereto in a nitrogen gas atmosphere, and heating the material at a temperature of 60 to 100° C. to completely harden the material. The organic buffer layer material printed when the second organic buffer layer 192 is formed comes into contact with the first organic buffer layer 191, not the cathode protecting layer 18. Therefore, when the same material as that forming the first organic buffer layer 191, having relatively high wettability, is used, it is difficult to satisfy θ1<θ2. Therefore, in this embodiment, the second organic buffer layer 192 is formed of a material that slightly differs from the organic buffer layer material used for forming the first organic buffer layer 191 in at least one of viscosity and composition.

Then, an oxygen plasma process is performed in a low pressure atmosphere again to form the gas barrier layer 20 so as to completely cover the first organic buffer layer 191 and the second organic buffer layer 192 including their edges, by using a high-density plasma deposition method, such as an ECR sputtering method or an ion plating method. The oxygen plasma process is performed to improve adhesion between the second organic buffer layer 192 and the gas barrier layer 20. Subsequently, a resin adhesive having high transmittance is applied so as to cover the inorganic insulating layer 12, the cathode protecting layer 18, and the gas barrier layer 20, and the entire lower surface of the surface protecting substrate 22 is brought into contact with the resin adhesive. Then, the resin adhesive is hardened to form the adhesive layer 21. Alternatively, a liquid adhesive may be used instead of the resin adhesive, or the second gas barrier layer 12 and the surface protecting substrate 22 may be bonded to each other by interposing a sheet-shaped adhesive between the second gas barrier layer 12 and the surface protecting substrate 22 and applying pressure thereto.

Effects

In the organic EL panel according to this embodiment, since the organic buffer layer has a two-layer structure, the thickness of each of the organic buffer layers is smaller than that of the organic buffer layer having a single-layer structure. Therefore, the angle of the edge of each of the organic buffer layers is smaller than that of the organic buffer layer having a single-layer structure. More specifically, the angle of the first edge portion 191c of the first organic buffer layer 191 is smaller than 20°. In addition, a region of the main substrate 10 overlapping the second organic buffer layer 192 is included in a region of the main substrate 10 overlapping the first organic buffer layer 191, and the second constant portion 192b and the second edge portion 192c overlap the first constant portion 191b. Therefore, the angle of a rising portion of the gas barrier layer 20 slightly increases, which makes it difficult for the gas barrier layer 20 to be split or peeled off. Thus, according to the organic EL panel of this embodiment, since the gas barrier layer 20 is hardly split or peeled off, it is possible to reliably seal a plurality of organic EL elements P1 with the gas barrier layer 20.

Further, according to the organic EL panel, the thickness of the second organic buffer layer 192, which is an upper layer, is larger than that of the first organic buffer layer 191, which is a lower layer, but the size of the second organic buffer layer 192 is smaller than that of the first organic buffer layer 191. Therefore, in order to improve the sealing property of the plurality of organic EL elements P1, even when the total thickness of the first organic buffer layer 191 and the second organic buffer layer 192 is sufficiently large, the rise angle of the gas barrier layer 20 is equal to that of the first edge portion 191c of the first organic buffer layer 191 having a smaller thickness than the second organic buffer layer 192. In addition, since the second constant portion 192b and the second edge portion 192c overlap the first constant portion 191b, the gas barrier layer 20 rises along the first edge portion 191c and the second edge portion at the rising portion. Therefore, even when the thickness of the second organic buffer layer 192, which is an upper layer having a small size, is large and the angle of the second edge portion 192c is inclined at a large angle, the gas barrier layer 20 gradually rises. In this way, it is possible to sufficiently increase the total thickness of the first organic buffer layer 191 and the second organic buffer layer 191 overlapping the plurality of organic EL elements P1 while gradually raising the gas barrier layer 20.

For example, a cap-shaped sealing substrate is used to seal the organic EL elements. Meanwhile, an increase in the size of the organic EL panel and a reduction in the thickness and weight thereof have been demanded. In order to meet the demands, when the cap-shaped sealing substrate is used, the edges of the sealing substrate and the main substrate are sealed by an adhesive, which makes it difficult to make the organic EL panel have sufficient strength against external stress. In contrast, in the organic EL panel according to this embodiment, a so-called thin sealing film comes into contact with the plurality of organic EL elements P1 with a large contact area to seal the organic EL elements P1, which makes it possible to remarkably improve the strength of the organic EL panel, to prevent the gas barrier layer from being cracked or peeled off, and to improve the sealing property of the plurality of organic EL elements P1. Therefore, the organic EL panel according to this embodiment can meets the demands for an increase in the size of the organic EL panel and a reduction in the thickness and weight thereof. When the size of the organic EL panel becomes large, the number of TFTs and wiring lines provided between the organic EL elements and the main substrate increases. Therefore, in a bottom emission type in which light from an organic light-emitting layer is emitted from the main substrate, the aperture ratio of pixels may be reduced and thus luminous efficiency may be lowered. However, since the organic EL panel is a top emission type, the above-mentioned problems do not arise.

In order to prevent the adhesion of a foreign material, such as dust, or water, it is preferable that the organic EL panel be manufactured under a high vacuum lower than 1 Pa. However, since the organic buffer layer material is in a liquid state, it is difficult to form the organic buffer layer under high vacuum. Therefore, in this embodiment, the organic buffer layer is formed by a screen printing method in a low pressure atmosphere in the range of 100 to 5000 Pa. This contributes to the removal of pinholes of the gas barrier layer by removing bubbles generated at the time of coating and covering the foreign material. In addition, the gas barrier layer is formed by a high-density plasma deposition method under a high vacuum of 0.1 to 10 Pa at low temperature. Therefore, when the gas barrier layer is formed, the plurality of organic EL elements are not damaged. As can be apparently seen from the above-mentioned manufacturing procedure, a process of sealing the organic EL panel is little affected by minute foreign materials existing even in a clean room. This is very advantageous, considering the fact that it is difficult to perform a cleaning process until the sealing process is finished once the formation of the organic light-emitting layer starts.

Second Embodiment

An organic EL panel according to a second embodiment of the invention is similar to the organic EL panel according the first embodiment except for the structure of an organic buffer layer.

Figure 3:
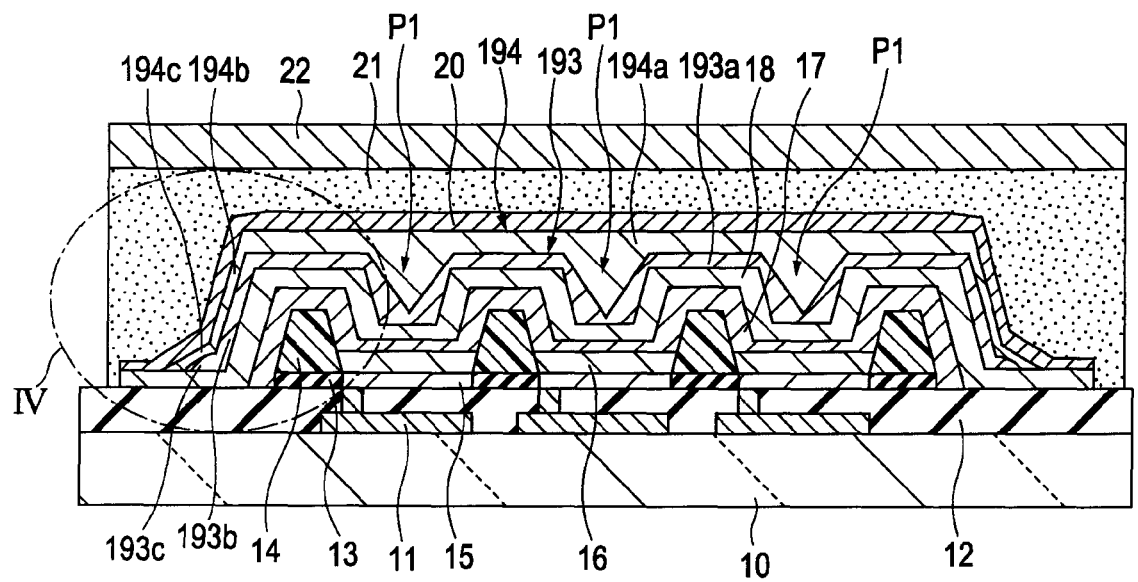
FIG. 3 is a cross-sectional view illustrating an organic EL panel according to a second embodiment of the invention.
Figure 4:
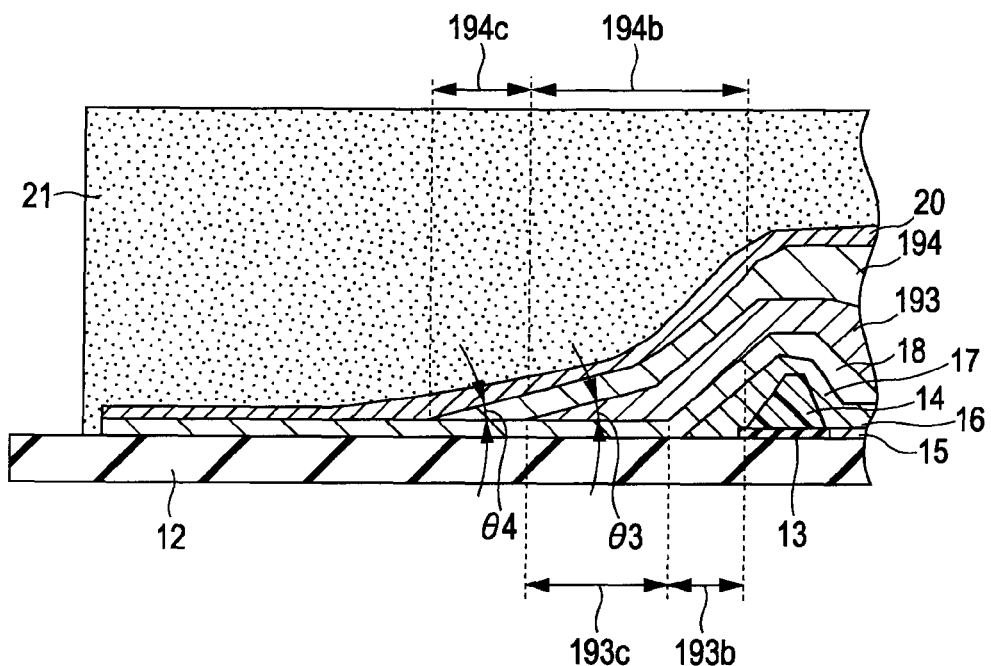
FIG. 4 is an enlarged cross-sectional view illustrating a portion B of FIG. 3.

FIG. 3 is a cross-sectional view of the organic EL panel. FIG. 4 is an enlarged cross-sectional view illustrating a portion B of the organic EL panel. In the organic EL panel, a first organic buffer layer 193 is formed on a cathode protecting layer 18 so as to overlap a plurality of EL elements P1. A second organic buffer layer 194 is formed on the first organic buffer layer 193 so as to cover the first organic buffer layer 193. A gas barrier layer 20 is formed on the cathode protecting layer 18, the first organic buffer layer 193, and the second organic buffer layer 194 so as to cover both the organic buffer layers.

The first organic buffer layer 193 and the second organic buffer layer 194 are provided to improve the flatness and adhesion of the gas barrier layer 20 and to buffer stress occurring in the gas barrier layer 20. The organic buffer layers are formed by applying the above-mentioned organic buffer layer material in a low pressure atmosphere and hardening the material. Then, the two organic buffer layers are bonded to each other. A region of the main substrate 10 overlapping the first organic buffer layer 193 is included in another region of the main substrate 10 overlapping the second organic buffer layer 194.

The first organic buffer layer 193 includes a first covering portion 193a overlapping all the organic EL elements P1, a first constant portion 193b that has a constant thickness and surrounds the first covering portion 193a, and a first edge portion 193c that surrounds the first constant portion 193b and is tapered off toward the edge thereof. Since the first organic buffer layer 193 is formed by applying a liquid material, an angle θ3 formed between the upper surface of the first edge portion 193c and the upper surface of the main substrate 10 at the edge of the first organic buffer layer 193 corresponds to the thickness of the first constant portion 193b.

Meanwhile, the second organic buffer layer 194 includes a second covering portion 194a overlapping all the organic EL elements P1, a second constant portion 194b that has a constant thickness and surrounds the second covering portion 194a, and a second edge portion 194c that surrounds the second constant portion 194b and is tapered off toward the edge thereof. The second organic buffer layer 194 is formed by applying a liquid material, and the application is performed to planarize the upper surface of the second covering portion 194a.

In this embodiment, the upper limit of the thickness of the second constant portion 194b is determined such that a rise angle θ4 of the second edge portion 194c is smaller than 20° at the edge of the second organic buffer layer 194. When the second organic buffer layer 194 is formed to satisfy the condition, the thickness of the first constant portion 193b, that is, the rise angle θ3 of the first organic buffer layer 193 is determined such that the upper surface of the second covered potion 194a is planarized. In this embodiment, θ3 is approximately equal to θ4. In addition, the thickness of the first organic buffer layer 193 is determined, considering the height of pixel partition walls or the ratio of light leaking from the side surface of the surface protecting substrate 22 or the side surface of an adhesive layer, which will be described later, such that light effectively passes through the upper surface of the surface protecting substrate 22 having, for example, the function of a color filter.

In the organic EL panel according to this embodiment, the organic buffer layer has a two-layer structure, and a region of the main substrate 10 overlapping the first organic buffer layer 193, which is a lower layer, is included in a region of the main substrate 10 overlapping the second organic buffer layer 194, which is an upper layer. In addition, the thickness of the first organic buffer layer 193 is larger than that of the second organic buffer layer 194. Further, the first constant portion 193b and the first edge portion 193c overlap the second constant portion 194b. Therefore, the organic EL panel according to the second embodiment can obtain the same effects as the organic EL panel according to the first embodiment.

In the organic EL panels according to the first and second embodiments, it is difficult for the gas barrier layer to be split or peeled off, which makes it possible for light to be continuously emitted with uniform brightness for a long time. Experiments are made to prove the above. According to the experiments, the organic EL panels according to the first and second embodiments and other organic EL panels are continuously exposed at a temperature of 60° C. and a relative humidity (RH) of 90% for 600 hours, and the luminous state after the exposure is examined. The organic EL panels used for the experiments each have pixel partition walls having an average step difference of 3 μm, organic buffer layers formed of epoxy resin, and a gas barrier layer (having a thickness of 500 nm) formed of silicon oxynitride.

As the results of the experiments, in the organic EL panel having only one organic buffer layer that includes a constant portion having a thickness of 20 μm (an angle formed between the upper surface of the organic buffer layer and the upper surface of the main substrate at the edge of the organic buffer layer is in the range of 20 to 25°), some of the plurality of organic EL elements arranged in a peripheral portion (the periphery of a tapered portion of the organic buffer layer) have bad luminous efficiency. In the organic EL panel which has two organic buffer layers, each including a constant portion having a thickness of 10 μm, and in which a region of the main substrate overlapping a lower gas barrier layer completely corresponds to a region of the main substrate overlapping an upper gas barrier layer (an angle formed between the upper surface of the organic buffer layer and the upper surface of the main substrate at the edge of the organic buffer layer is in the range of 25 to 30°), some of the plurality of organic EL elements arranged in a peripheral portion have bad luminous efficiency. The reason why the organic EL elements arranged in the peripheral portion have bad luminous efficiency in both the organic EL panels is that the gas barrier layer positioned in the vicinity of a tapered portion of the organic buffer layer is split or peeled off, which causes water to be infiltrated thereinto.

In contrast, in the organic EL panel according to the second embodiment which has two organic buffer layers, each having a thickness of 10 μm, and in which a region of the main substrate overlapping one organic buffer layer close to the main substrate is included in another region of the main substrate overlapping the other organic buffer layer far from the main substrate (an angle formed between the upper surface of the organic buffer layer having a larger size and the upper surface of the main substrate at the edge of the organic buffer layer is in the range of 10 to 15°), all the organic EL elements have good luminous efficiency.

In the organic EL panel according to the first embodiment which has two organic buffer layers, that is, a first organic buffer layer having a thickness of 5 μm and a second organic buffer layer having a thickness of 10 μm and in which a region of the main substrate overlapping the second organic buffer layer is included in another region of the main substrate overlapping the first organic buffer layer (an angle formed between the upper surface of the first organic buffer layer and the upper surface of the main substrate at the edge of the first organic buffer layer is in the range of 5 to 10°), all the organic EL elements have good luminous efficiency. In addition, in the organic EL panel including the second organic buffer layer (having a small size) having a thickness of 20 μm (an angle formed between the upper surface of the first organic buffer layer and the upper surface of the main substrate at the edge of the first organic buffer layer is in the range of 5 to 10°), all the organic EL elements also have good luminous efficiency.

Third Embodiment

The structure of an organic buffer layer of an organic EL panel according to a third embodiment of the invention is the same as that of the organic buffer layer of the organic EL panel according to the second embodiment. However, the organic EL panel according to the third embodiment is a full color panel using a low-molecular-weight-based organic EL material, which will be described later, and can perform full color display using organic EL elements emitting white light and color filters.

Structure

Figure 5:
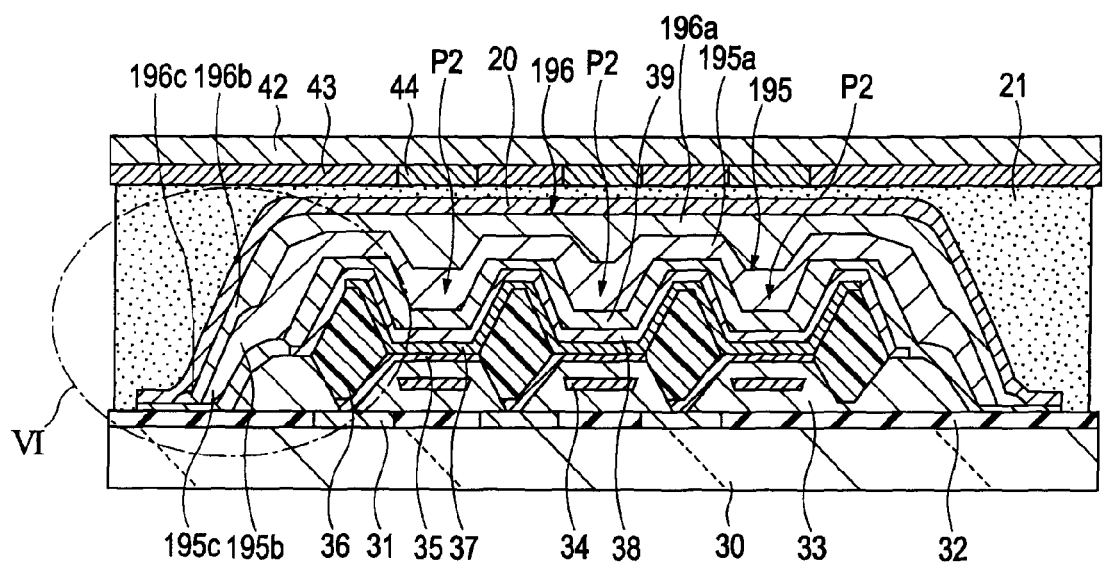
FIG. 5 is a cross-sectional view illustrating an organic EL panel according to a third embodiment of the invention.
Figure 6:
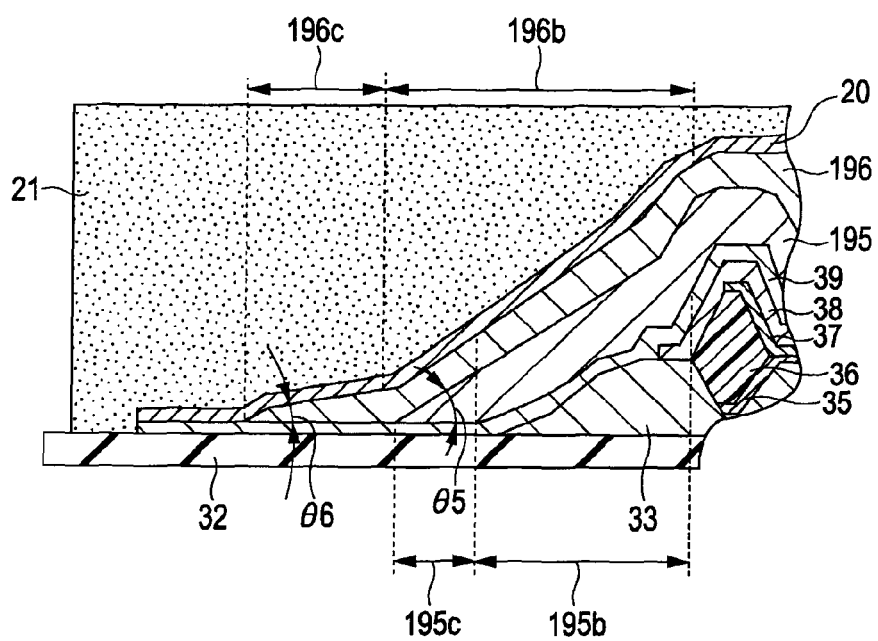
FIG. 6 is an enlarged cross-sectional view illustrating a portion C of FIG. 5.

FIG. 5 is a cross-sectional view illustrating the organic EL panel, and FIG. 6 is an enlarged cross-sectional view illustrating a portion C of the organic EL panel. The organic EL panel includes a flat main substrate 30. The main substrate 30 is formed of glass or plastic, and a plurality of organic EL elements P2 are formed on the main substrate 30. The organic EL element P2 is an element that emits white light, has an organic light-emitting layer 37 formed of a low-molecular-weight-based organic EL material, which will be described later, and is supplied with electric energy to cause the organic light-emitting layer 37 (specifically, a light-emitting layer within the organic light-emitting layer 37) to emit light.

Further, a plurality of TFTs 31, which correspond to the plurality of organic EL elements P2, and various wiring lines (not shown) are formed on the main substrate 30. Similar to the TFTs 11 in the second embodiment, the TFTs 31 drive the corresponding organic EL elements P2. In addition, an inorganic insulating layer 32 is formed on the main substrate 30 so as to cover the plurality of TFTs 31. The inorganic insulating layer 32 is provided to insulate the plurality of TFTs 31 from various wiring lines and is formed of, for example, silicon nitride.

On a planarizing layer 33 removing a step difference caused by the wiring lines or the TFTs, a pixel partition wall insulation layer 36 that goes up from concave portions of the planarizing layer 33 is formed of an organic compound, such as polyimide or acrylic resin. The upper end of the pixel partition wall insulation layer 36 is positioned to be higher than convex portions of the planarizing layer 33, and the planarizing layer 33 and the pixel partition wall insulation layer 36 define the concave portions. A metal reflective layer 34 for reflecting light emitted from the organic EL element P2 through the anode 35 is formed in the planarizing layer 33, and the metal reflective layer 34 is formed of a reflective metallic material. An inorganic insulating layer for preventing corrosion is provided on the metal reflective layer 34 below the bottom of the concave portion, and the anode 35 formed of ITO having a high work function is formed thereon.

The organic EL elements P2 each have the anode 35 and a common cathode layer 38 with the organic light-emitting layer 37 interposed therebetween. The anode 35 and the common cathode layer 38 serve as electrodes for injecting holes and electrons into the organic light-emitting layer 37. The anode 35 is a thin transparent electrode that is formed on the planarizing layer 33 and is formed of, for example, a metallic material, such as aluminum, or ITO. The anode 35 is connected to the corresponding TFT 31 through a gap between the planarizing layer 33 and the pixel partition wall insulation layer 36. The common cathode layer 38 is formed on the organic light-emitting layer 37 and the pixel partition wall insulation layer 36 and serves as a common electrode with respect to the plurality of organic EL elements P2. For example, the common cathode layer 38 has an electron injection buffer layer, which facilitates electrons to be injected into the organic light-emitting layer 37, and a low-resistance layer, such as a transparent ITO layer formed on the electron injection layer or an aluminum layer that is formed on a non-pixel region. The electron injection buffer layer is formed of, for example, lithium fluoride or magnesium-silver alloy.

The organic light-emitting layer 37 corresponds to the organic light-emitting layer 16 in the second embodiment. The organic light-emitting layer 37 according to the third embodiment differs from the organic light-emitting layer 16 according to the second embodiment in that the organic light-emitting layer 37 is formed continuously on the anode 35 and the pixel partition wall insulation layer 36 and is formed of a low-molecular-weight-based organic EL material. The low-molecular-weight-based organic EL material is an organic compound having a relatively low molecular weight, among organic compounds that emit light by excitation due to the recombination of holes and electrons. Examples of the low-molecular-weight-based organic EL material include, for example, a material obtained by doping anthracene-based impurities into styrylamine-base host, and a material obtained by doping rubrene-based impurities into styrylamine-base host. When the organic light-emitting layer 37 includes an additional layer contributing to the recombination in the light-emitting layer, a material forming the additional layer is determined according to a material forming a layer adjacent to the additional layer. For example, the hole injection layer is formed of triallylamine (ATP) polymer, and the hole transport layer is formed of, for example, a triphenyl diamine (TPD) based compound. In addition, the electron injection layer is formed of, for example, an aluminum quinolinol complex.

Furthermore, a cathode protecting layer 39 is formed on the inorganic insulating layer 32 and the common cathode layer 38 so as to cover the common cathode layer 38 and the planarizing layer 33. In addition, a first organic buffer layer 195 is formed on the cathode protecting layer 39 so as to completely cover the plurality of organic EL elements P2, the pixel partition wall insulation layer 36, and the planarizing layer 33. In addition, a second organic buffer layer 196 is formed on the cathode protecting layer 39 and the first organic buffer layer 195 so as to cover the first organic buffer layer 195. A gas barrier layer 20 is formed on the cathode protecting layer 39 and the second organic buffer layer 196 so as to cover the second organic buffer layer 196.

The cathode protecting layer 39, the first organic buffer layer 195, and the second organic buffer layer 196 correspond to the cathode protecting layer 18, the first organic buffer layer 193, and the second organic buffer layer 194 of the second embodiment. Therefore, the first organic buffer layer 195 includes a first covering portion 195a overlapping all the organic EL elements P2, a first constant portion 195b that has a constant thickness and surrounds the first covering portion 195a, and a first edge portion 195c that surrounds the first constant portion 195b and is tapered off toward the edge thereof. Meanwhile, the second organic buffer layer 196 includes a second covering portion 196a overlapping all the organic EL elements P2, a second constant portion 196b that has a constant thickness and surrounds the second covering portion 196a, and a second edge portion 196c that surrounds the second constant portion 196b and is tapered off toward the edge thereof.

In this embodiment, the upper limit of the thickness of the second constant portion 196b is determined such that a rise angle $\theta 6$ of the second edge portion 196c is smaller than 20° at the edge of the second organic buffer layer 196. When the second organic buffer layer 196 is formed to satisfy the condition, the thickness of the first constant portion 195b, that is, a rise angle $\theta 5$ of the first organic buffer layer 195 is determined such that the upper surface of the second covered potion 196a is planarized. In this embodiment, $\theta 5$ is approximately equal to $\theta 6$. In addition, the thickness of the first organic buffer layer 195 is determined, considering coatability for a step difference between pixel partition walls or the ratio of light leaking from the side surface of an adhesive layer 21, which will be described later, without reaching the lower surface of the color filter substrate 42.

Furthermore, an adhesive layer 21 is formed on the main substrate 30 so as to cover the inorganic insulating layer 32, the cathode protecting layer 39, and the gas barrier layer 20. In addition, a color filter substrate 42 is fixed to the adhesive layer 21 so as to completely overlap the adhesive layer 21. The entire lower surface of the color filter substrate 42 is adjacent to the adhesive layer 21. The color filter substrate 42 is provided to extract red, green, and blue light components from light components emitted from the organic EL elements P2, and includes a black matrix layer 43 having low light transmittance and filter layers 44 that cover openings formed in the black matrix layer 43. The black matrix layer 43 has a plurality of openings. In addition, three types of filter layers 44, that is, a filter layer for transmitting only red light, a filter layer for transmitting only green light, and a filter layer for transmitting only blue light, are provided. Each of the filter layers 44 overlaps the organic EL elements P2. The red, green, and blue light components of the light components emitted from the organic EL elements P2 overlapping the filter layers 44 are transmitted through the corresponding filter layers 46, respectively. Furthermore, the color filter substrate 42 serves to protect the gas barrier layer, and portions other than the black matrix layer 43 and the filter layers 44 are formed of glass or plastic having high light transmittance. Examples of the plastic include polyethyleneterephthalate, acrylic resin, polycarbonate, and polyolefin. In addition, the color filter substrate 42 may have a function of blocking/absorbing ultraviolet rays, a function of preventing reflection of external light, or a function of heat dissipation.

Manufacturing Procedure

In order to manufacture the organic EL panel according to the present embodiment, first, the TFTs 31, various wiring lines, and the inorganic insulating layer 32 are formed on the main substrate 30. Then, the planarizing layer 33 and the metal reflective layer 34 are formed on the inorganic insulating layer 32. Then, in order to prevent corrosion of the metal reflective layer 34, the surface and a peripheral portion of the metal reflective layer 34 are coated with an inorganic insulating layer, and then a plurality of anodes 35 are formed. Thus, the TFTs 31 and the anodes 35 are connected to each other in a one-to-one manner. As a method of forming the anodes 35, it is possible to use one of the known methods suitable for a material forming the anodes 35. Then, the pixel partition wall insulation layer 36 is formed on parts of the anodes 35 and the planarizing layer 33 by coating and patterning, for example, polyimide. Then, a cleaning process, such as plasma cleaning, is performed to remove organic-based contamination from the main substrate 30 or to increase the work function.

Thereafter, the organic light-emitting layer 37 common to the plurality of organic EL elements P2 is formed on the exposed anodes 35. In this process, a light-emitting layer is formed of a low-molecular-weight-based organic EL material. The process of forming the organic light-emitting layer 37 is performed using a vacuum deposition method using a heating boat. The vacuum deposition method can also be applied to a case in which the organic light-emitting layer 37 includes only a light-emitting layer or a case in which the organic light-emitting layer 37 includes a plurality of layers. When the organic light-emitting layer 37 includes the plurality of layers, the plurality of layers are sequentially formed.

Then, an electrode common to the plurality of organic EL elements P2, that is, the common cathode layer 38 is formed. Subsequently, an oxygen plasma process is performed, and then the cathode protecting layer 39 is formed so as to cover the common cathode layer 38. Then, the first organic buffer layer 195 is formed on the cathode protecting layer 39 by using a screen printing method in a low pressure atmosphere, and the second organic buffer layer 196 is formed. Successively, an oxygen plasma process is performed to form the gas barrier layer 20 so as to cover the second organic buffer layer 196.

Subsequently, a resin adhesive having high light transmittance is coated so as to cover the inorganic insulating layer 32, the cathode protecting layer 39, and the gas barrier layer 20. Then, the entire lower surface of the color filter substrate 42 comes in contact with the resin adhesive, and the resin adhesive is cured, thereby forming the adhesion layer 21. This curing is performed at locations at which a plurality of filters 44 of the color filter substrate 42 overlap the corresponding plurality of organic EL elements P2. In addition, a variation of the adhesion of the surface protecting substrate 22 in the first embodiment can also be applied to a variation of the adhesion of the color filter substrate 42.

Effects

In the organic EL device according to this embodiment, the organic buffer layer has a two-layer structure, and a region of the main substrate 30 overlapping the first organic buffer layer 195, which is a lower layer and a smaller size, is included in a region of the main substrate 30 overlapping the second organic buffer layer 196, which is an upper layer and has a larger area. In addition, the thickness of the first organic buffer layer 195 is larger than that of the second organic buffer layer 196. Further, the first constant portion 195b and the first edge portion 195c overlap the second constant portion 196b. In this way, the organic EL panel according to the third embodiment can have the same effects as the organic EL panel according to the second embodiment.

Fourth Embodiment

Figure 7:
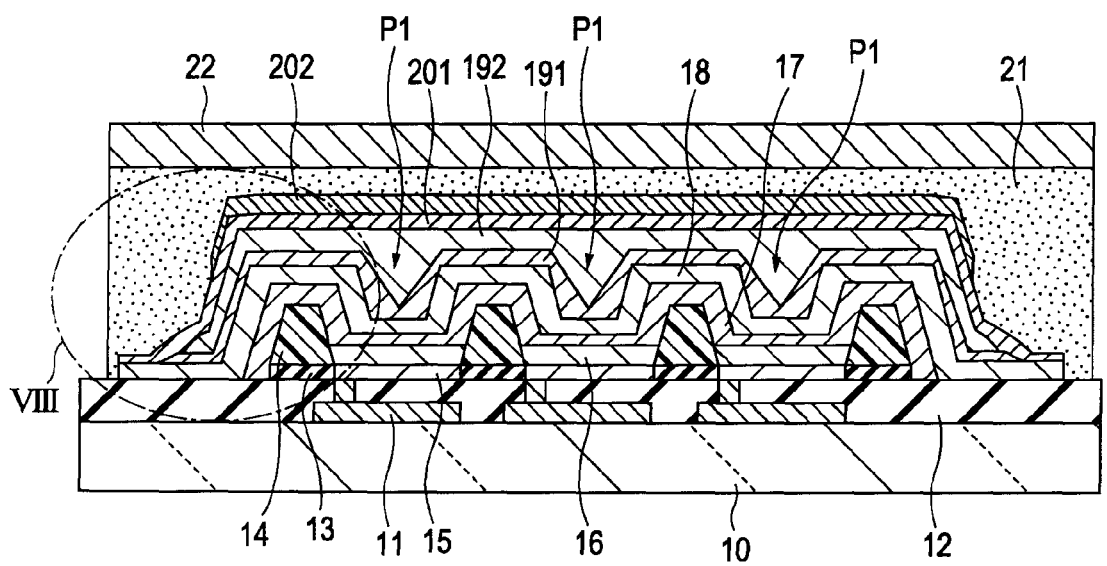
FIG. 7 is a cross-sectional view illustrating an organic EL panel according to a fourth embodiment of the invention.
Figure 8:
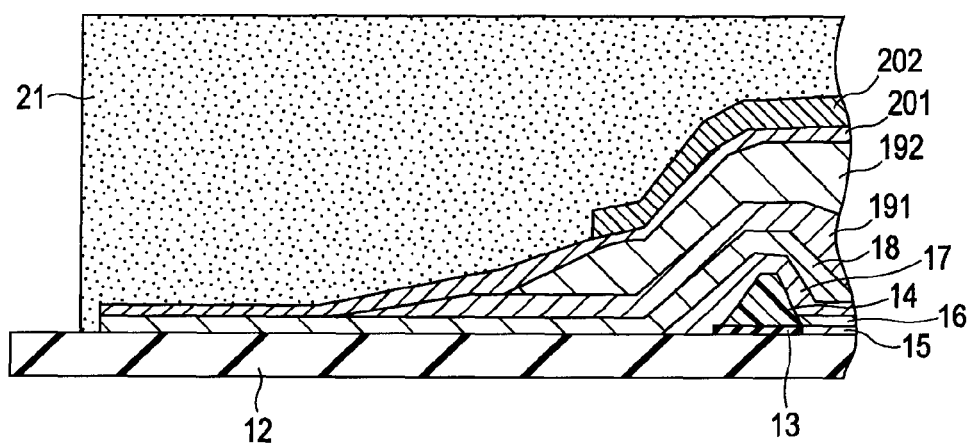
FIG. 8 is an enlarged cross-sectional view illustrating a portion D of FIG. 7.

FIG. 7 is a cross-sectional view illustrating an organic EL panel according to a fourth embodiment of the invention. FIG. 8 is an enlarged cross-sectional view illustrating a portion D of the organic EL panel. As can be apparently seen from FIGS. 7 and 8, the organic EL panel according to the fourth embodiment is similar to the organic EL panel according to the first embodiment except for the structure of a gas barrier layer.

In the organic EL panel according to this embodiment, the gas barrier layer is divided into a first gas barrier layer 201 and a second gas barrier layer 202. The first gas barrier layer 201 is formed on the cathode protecting layer 18, the first organic buffer layer 191, and the second organic buffer layer 192 such that it adheres closely to the first organic buffer layer 191 and the second organic buffer layer 192 to cover the first and second organic buffer layers 191 and 192. The second gas barrier layer 202 is formed on the first gas barrier layer 201 such that it covers a plurality of organic EL elements P1 and the edge of the first organic buffer layer 191 is exposed. The two gas barrier layers are formed of the same material as the gas barrier layer 20 according to the first embodiment, and are closely adhered to each other.

The first gas barrier layer 201 contributes to improving the sealing of the first organic buffer layer 191, the second organic buffer layer 192, and the plurality of organic EL elements P1. The thickness of the first gas barrier layer 201 is in the range of 200 nm to 400 nm. The lower limit of the range is determined so as to sufficiently seal the side surfaces of the organic buffer layers and the peripheries thereof. The second gas barrier layer 202 contributes to improving the sealing of the plurality of organic EL elements P1. The thickness of the second gas barrier layer 202 is in the range of 200 nm to 800 nm. In this embodiment, the thicknesses of the two gas barrier layers are restricted such that the sum of the thickness of the first gas barrier layer 201 and the thickness of the second gas barrier layer 202, that is, the total thickness of the two gas barrier layers is smaller than 1000 nm. The restriction of thickness is determined considering the degree of the sealing of the plurality of organic EL elements P1, the possibility of the gas barrier layer being cracked or peeled off, and manufacturing costs.

The organic EL panel according to the fourth embodiment can obtain the same effects as the organic EL panel according to the first embodiment. It is necessary to increase the thickness of the gas barrier layer in order to improve the sealing property. However, when the gas barrier layer has a constant thickness over the entire range, stress concentrates on a non-flat portion of the gas barrier layer. In contrast, according to this embodiment, since the gas barrier layer includes the first gas barrier layer 201 and the second gas barrier layer 202, it is possible to sufficiently increase the total thickness of the gas barrier layers overlapping all the organic EL elements P1 and to decrease the thickness of the gas barrier layers at the edge of the first organic buffer layer 191 where the gas barrier layers rise. Thus, it is possible to improve the sealing property of the plurality of organic EL elements P1 and to prevent the gas barrier layer from being cracked or peeled off.

Fifth Embodiment

Figure 9:
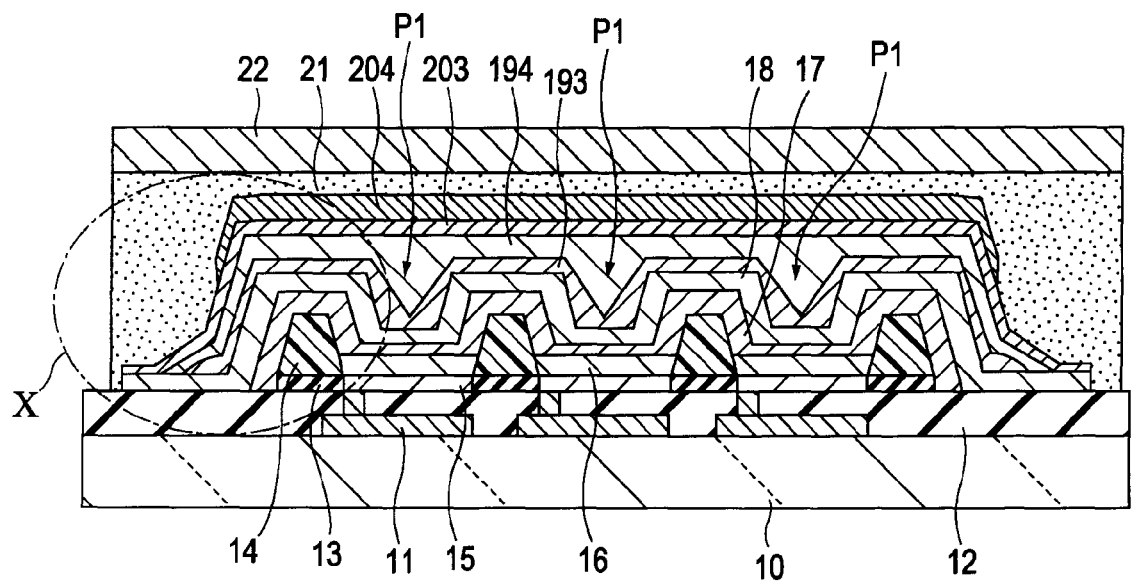
FIG. 9 is a cross-sectional view illustrating an organic EL panel according to a fifth embodiment of the invention.
Figure 10:
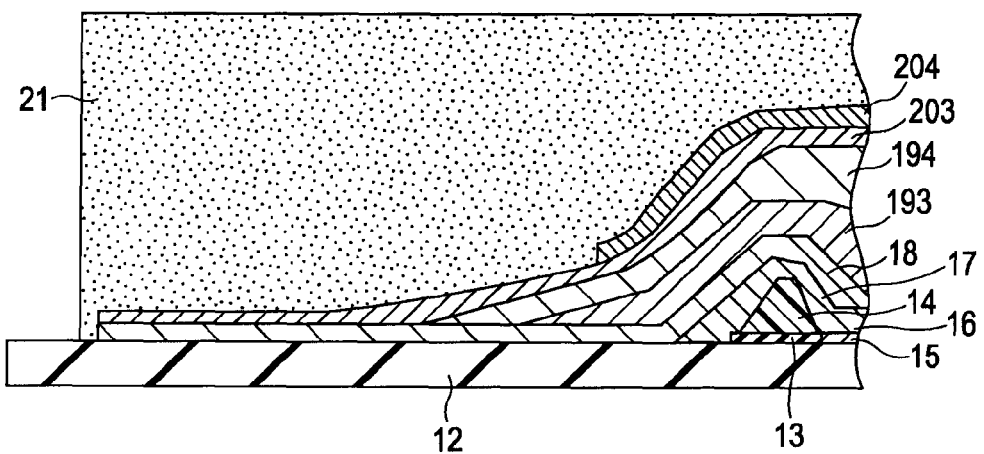
FIG. 10 is an enlarged cross-sectional view illustrating a portion E of FIG. 9.

FIG. 9 is a cross-sectional view illustrating an organic EL panel according to a fifth embodiment of the invention. FIG. 10 is an enlarged cross-sectional view illustrating a portion E of the organic EL panel. As can be apparently seen from FIGS. 9 and 10, the organic EL panel according to the fifth embodiment is similar to the organic EL panel according to the second embodiment except for the structure of a gas barrier layer. The organic EL panel according to this embodiment includes a first gas barrier layer 203 and a second gas barrier layer 204 corresponding to the first gas barrier layer 201 and the second gas barrier layer 202 according to the fourth embodiment, respectively.

The organic EL panel according to the fifth embodiment can obtain the same effects as the organic EL panel according to the second embodiment. The first gas barrier layer 203 and the second gas barrier layer 204, serving as the gas barrier layer, make it possible to improve the sealing property of a plurality of organic EL elements P1 and to prevent the gas barrier layer from being cracked or peeled off.

Sixth Embodiment

Figure 11:
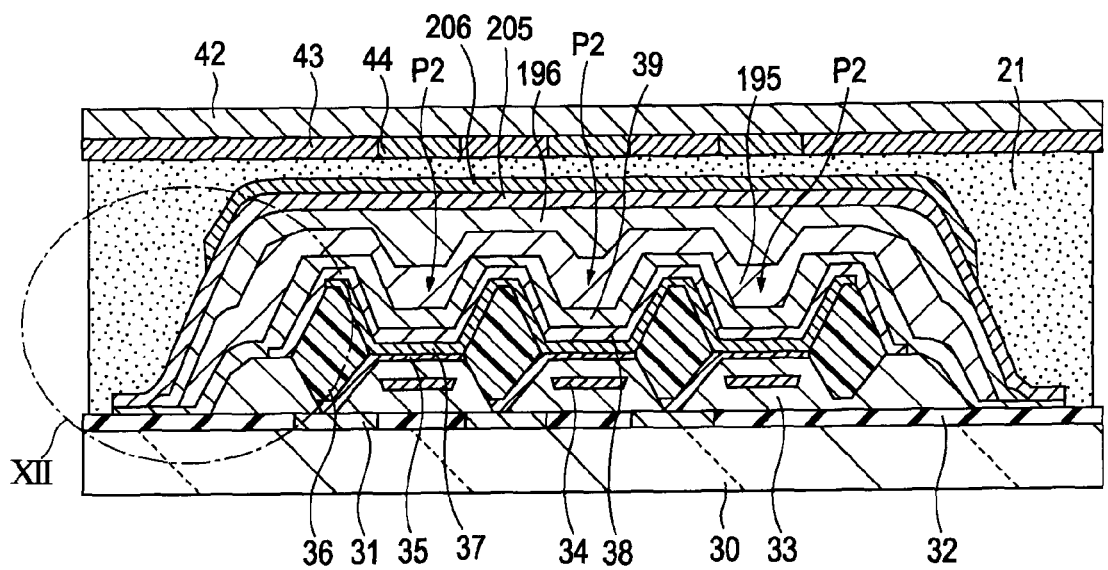
FIG. 11 is a cross-sectional view illustrating an organic EL panel according to a sixth embodiment of the invention.
Figure 12:
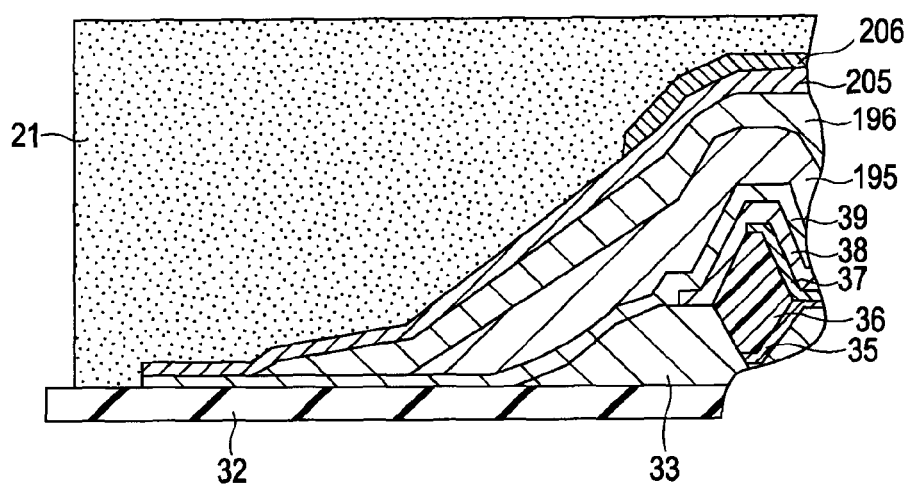
FIG. 12 is an enlarged cross-sectional view illustrating a portion F of FIG. 11.

FIG. 11 is a cross-sectional view illustrating an organic EL panel according to a sixth embodiment of the invention. FIG. 12 is an enlarged cross-sectional view illustrating a portion F of the organic EL panel. As can be apparently seen from FIGS. 11 and 12, the organic EL panel according to the sixth embodiment is similar to the organic EL panel according to the third embodiment except for the structure of a gas barrier layer. The organic EL panel according to this embodiment includes a first gas barrier layer 205 and a second gas barrier layer 206 corresponding to the first gas barrier layer 203 and the second gas barrier layer 204 according to the fifth embodiment, respectively.

The organic EL panel according to the sixth embodiment can obtain the same effects as the organic EL panel according to the third embodiment. The first gas barrier layer 205 and the second gas barrier layer 206, serving as the gas barrier layer, make it possible to improve the sealing property of a plurality of organic EL elements P1 and to prevent the gas barrier layer from being cracked or peeled off.

Modifications

According to a modification of the above-described embodiments, three organic buffer layers may be provided. However, in these organic buffer layers, a region of the main substrate overlapping one organic buffer layer should not completely overlap a region of the main substrate overlapping another organic buffer layer. This structure is similarly applied to the gas barrier layer. As a modification of the fourth to sixth embodiments, the second barrier layer far from the main substrate may cover the first barrier layer close to the main substrate.

According to another modification of the above-described embodiments, a panel emitting monochromatic light may be used, or a full color panel having a color conversion layer may be used. Alternatively, a bottom-emission-type panel may be used. In this case, only the layers below the light-emitting layer need to have high transmittance. Therefore, when the common cathode layer is arranged above the light-emitting layer, the common cathode layer formed of a metallic material having low resistance, such as aluminum, may be formed with a large thickness on the entire surface of the light-emitting layer.

Electronic Apparatus

The above-mentioned organic EL panel can be applied to various electronic apparatuses. In the invention, the organic EL panel is applied to an image display apparatus and an image printing apparatus.

Image Display Apparatus

An image display apparatus having the organic EL panel includes wiring lines for supplying electric energy and controls signals to the organic EL panel and a circuit for generating control signals allowing an optical image to be formed on the organic EL panel on the basis of image data supplied from an external device. Various types of image display apparatuses can be used, but in the invention, two types of image display apparatuses are exemplified.

Figure 13:
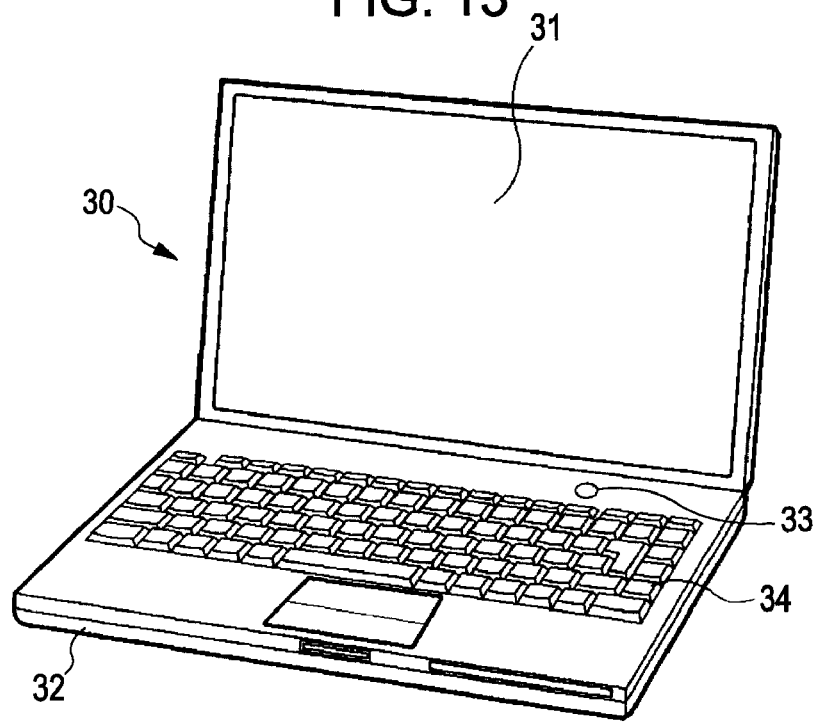
FIG. 13 is a diagram illustrating the appearance of a personal computer having the organic EL panel according to any one of the embodiments of the invention applied thereto.

FIG. 13 shows the structure of a personal computer using the above-mentioned organic EL panel as a display unit 31. A personal computer 30 includes the display unit 31, serving as a display device, and a main body 32. The main body 32 is provided with a power switch 33 and a keyboard 34. Since the personal computer 30 uses the above-mentioned organic EL panel as the display unit 31, it is possible to meet demands for an increase in the size of the display unit 31 and a reduction in the thickness and weight of the display device 31. In addition, since the quality of light emitted from the organic EL panel is hardly deteriorated, it is easy to keep display quality for a long time.

Figure 14:
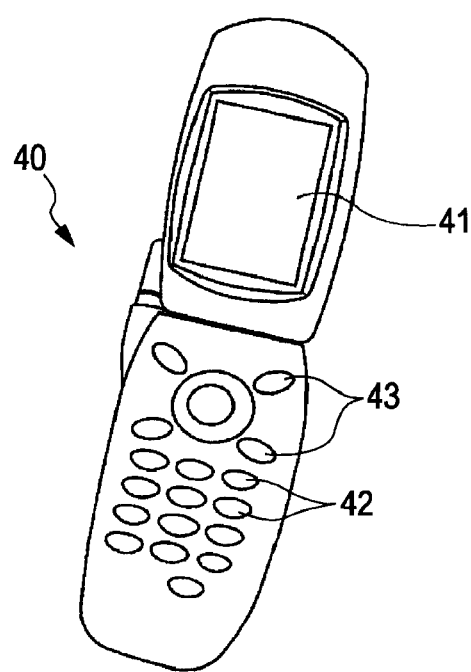
FIG. 14 is a diagram illustrating the appearance of a cellular phone having the organic EL panel according to any one of the embodiments of the invention applied thereto.

FIG. 14 shows the structure of a cellular phone using the above-mentioned organic EL panel as a display unit 41. A cellular phone 40 includes a plurality of operating buttons 42, a plurality of scroll buttons 43, and the display unit 41 serving as a display device. The scroll button 43 is operated to scroll a screen displayed on the display unit 41. Since the cellular phone 40 uses the above-mentioned organic EL panel as the display unit 41, it is possible to meet demands for a reduction in the thickness and weight of the display device 41. In addition, since the quality of light emitted from the organic EL panel is hardly deteriorated, it is easy to keep display quality for a long time.

Image Printing Apparatus

Next, an image printing apparatus using the above-mentioned organic EL panel will be described. This type of image printing apparatus includes a printer, a printing unit of a copy machine, and a printing unit of a facsimile. The above-mentioned organic EL panel can be applied to various types of image printing apparatuses. However, in the invention, two types of electrophotographic full color image printing apparatuses are used as examples of the image printing apparatus.

Figure 15:
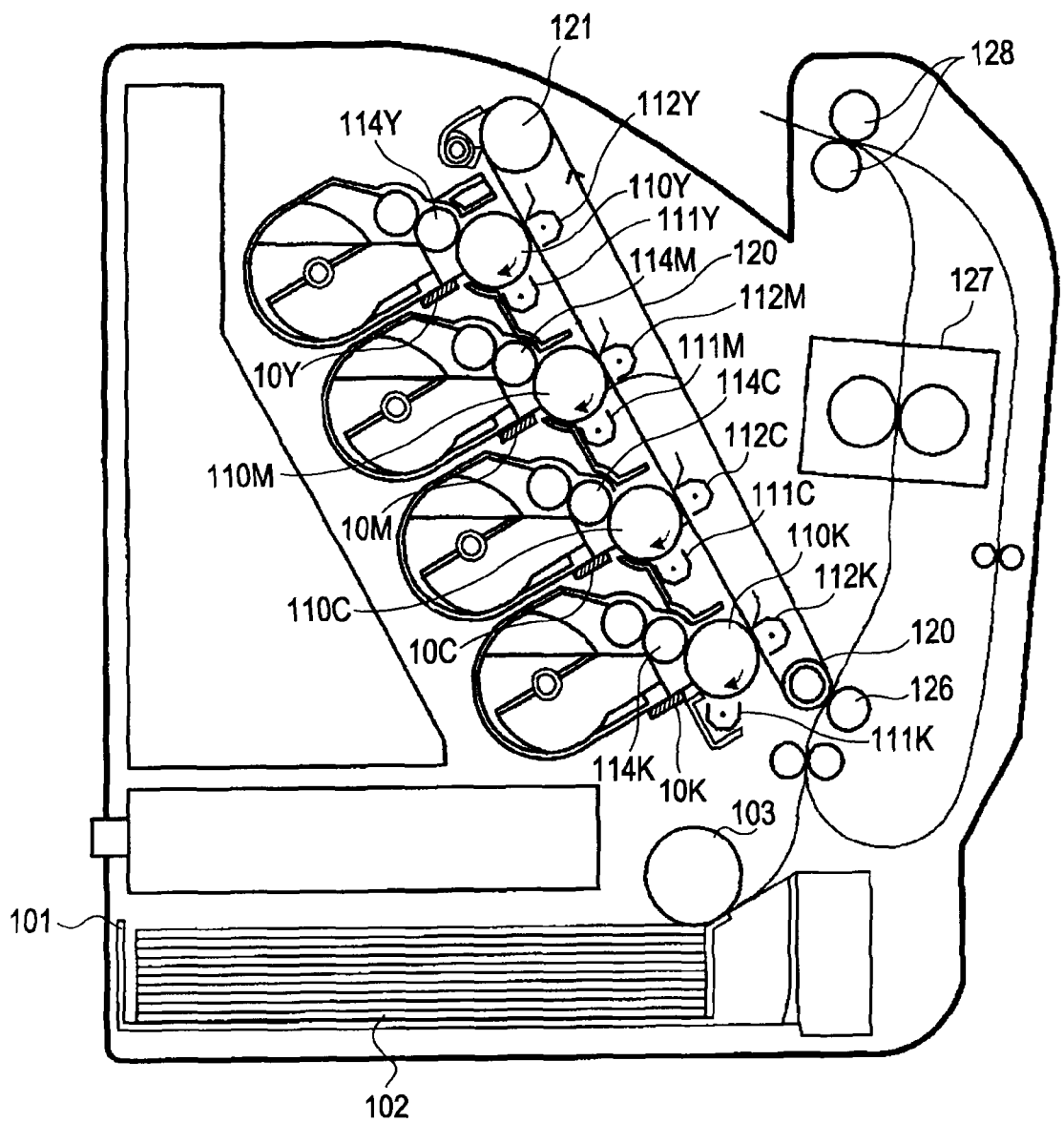
FIG. 15 is a longitudinal sectional view illustrating an example of an image printing apparatus using the organic EL panel according to any one of the embodiments of the invention.

FIG. 15 is a longitudinal sectional view showing an example of an image printing apparatus using the above-described organic EL panels as line-type exposure heads. The image printing apparatus is a tandem-type full-color image printing apparatus using a belt intermediate transfer method. In the image printing apparatus, four exposure heads 10K, 10C, 10M, and 10Y having the same configuration are arranged at exposure positions of four corresponding photoconductor drums (image carriers) 110K, 110C, 110M, and 110Y having the same configuration.

As shown in FIG. 15, the image printing apparatus is provided with a driving roller 121 and a driven roller 122, and an endless intermediate transfer belt 120 is wound around these rollers 121 and 122 so as to rotate around the rollers 121 and 122 in a direction represented by arrow. Although not shown in FIG. 15, the image printing apparatus may be provided with a tension applying member, such as a tension roller, that applies tension to the intermediate transfer belt 120.

The four photoconductor drums 110K, 110C, 110M, and 110Y each having a photosensitive layer on its outer peripheral surface are arranged at predetermined intervals from each other around the intermediate transfer belt 120. The suffixes K, C, M, and Y mean black, cyan, magenta, and yellow used for forming corresponding toner images, respectively. This is similarly applied to other members. The photoconductor drums 110K, 110C, 110M, and 110Y are driven to rotate in synchronization with the driving of the intermediate transfer belt 120.

A corona charging device 111 (K, C, M, and Y), the exposure head 10 (K, C, M, and Y), and a developing device 114 (K, C, M, and Y) are arranged around each photoconductor drum 110 (K, C, M, and Y). The corona charging device 111 (K, C, M, and Y) uniformly charges the outer peripheral surface of the corresponding photoconductor drum 110 (K, C, M, and Y). The exposure head 10 (K, C, M, and Y) writes an electrostatic latent image on the charged outer peripheral surface of the photoconductor drum. The exposure heads 10 (K, C, M, or Y) are arranged such that a plurality of organic EL elements are aligned along the generatrix (main scanning direction) of each of the photoconductor drums 110 (K, C, M, or Y). The writing of an electrostatic latent image is performed by radiating the photoconductor drums with light from the plurality of organic EL elements. The developing device 114 (K, C, M, and Y) deposits toner, serving as a developing agent, on the electrostatic latent image to form a toner image, i.e., a visible image on the corresponding photoconductor drum.

The black, cyan, magenta, and yellow toner images formed by the four single-color toner image forming stations are primarily transferred onto the intermediate transfer belt 120 sequentially so as to be superposed onto one another on the intermediate transfer belt 120. As a result, a full-color toner image is obtained. Four primary transfer corotrons (transferring device) 112 (K, C, M, and Y) are arranged inside the intermediate transfer belt 120. The primary transfer corotrons 112 (K, C, M, and Y) are arranged in the vicinities of the photoconductor drums 110 (K, C, M, and Y), respectively, and electrostatically attract the toner images from the photoconductor drums 110 (K, C, M, and Y) to transfer the toner images onto the intermediate transfer belt 120 passing between the photoconductor drums and the primary transfer corotrons.

A sheet 102 as a target on which an image is to be finally formed is fed one by one from a sheet feed cassette 101 by a pickup roller 103, and is then sent to a nip between the intermediate transfer belt 120 abutting on the driving roller 121 and a secondary transfer roller 126. The full-color toner images on the intermediate transfer belt 120 are secondarily transferred onto one side of the sheet 102 collectively by the secondary transfer roller 126, and then the transferred image passes between a pair of fixing rollers 127, serving as a fixing unit, to be fixed on the sheet 102. Thereafter, the sheet 102 is discharged to a sheet discharge cassette that is formed on the top of the image printing apparatus, by a pair of sheet discharge rollers 128.

Further, according to the above-described image printing apparatus, since the above-mentioned organic EL panels are used as the exposure heads 10 (K, C, M and Y), it is possible to meet demands for a reduction in the size of the exposure head. In addition, since the quality of light emitted from the organic EL panel is hardly deteriorated, it is easy to keep display quality for a long time.

Figure 16:
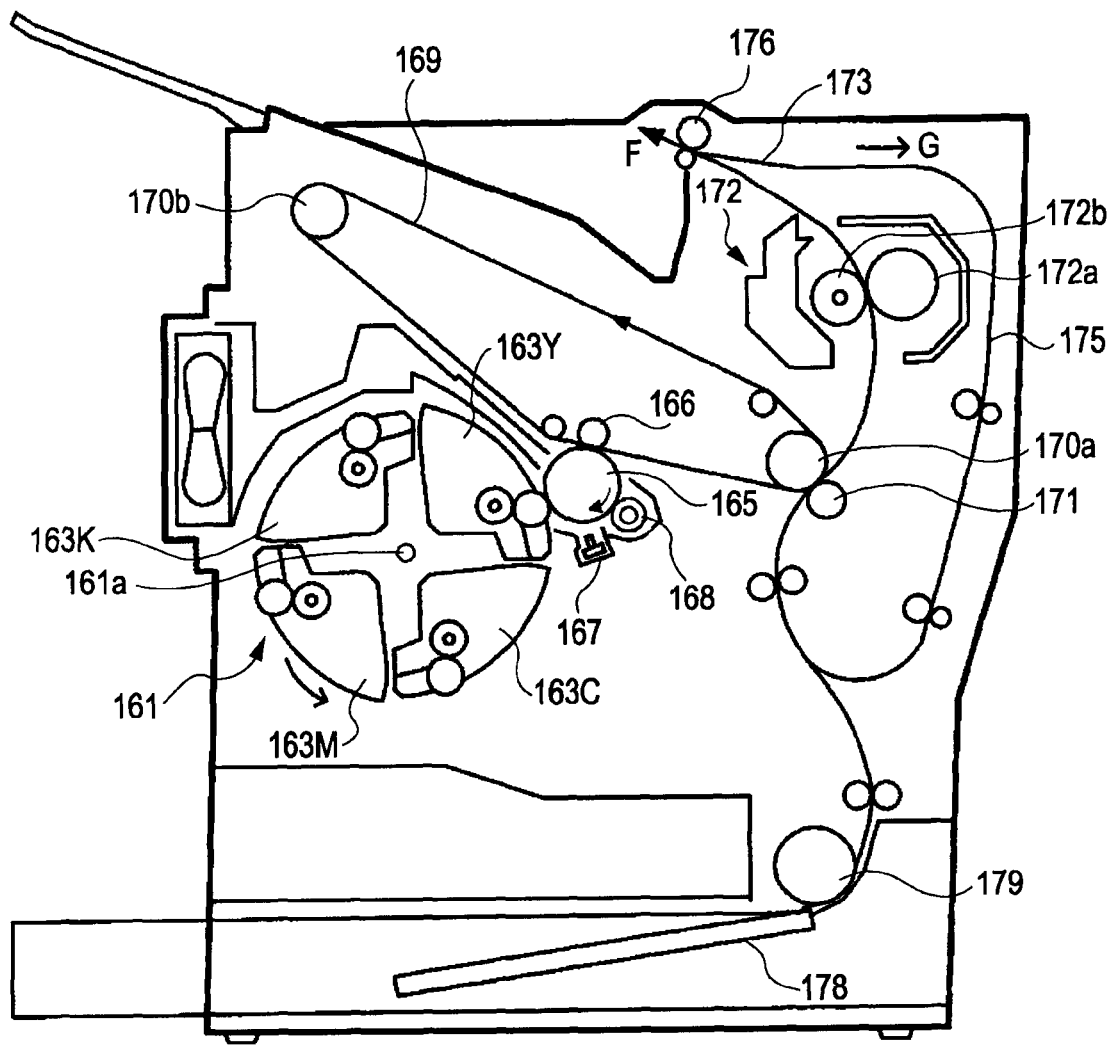
FIG. 16 is a longitudinal sectional view illustrating another example of the image printing apparatus using the organic EL panel according to any one of the embodiments of the invention.

FIG. 16 is a longitudinal sectional view showing another image printing apparatus using the above-mentioned EL panel as a line-type exposure head. The image printing apparatus is a rotary-development-type full-color image printing apparatus using a belt intermediate transfer method.

In the image printing apparatus shown in FIG. 16, a corona charging device 168, a rotary developing unit 161, an exposure head 167, and an intermediate transfer belt 169 are provided around a photoconductor drum (image carrier) 165.

The corona charging device 168 uniformly charges the outer peripheral surface of the photoconductor drum 165. The exposure head 167 writes an electrostatic latent image on the charged outer peripheral surface of the photosensitive drum 165. The exposure head 167, which is the above-mentioned organic EL panel, is arranged such that a plurality of organic EL elements are aligned along the generatrix (main scanning direction) of the photoconductor drum 165. The writing of an electrostatic latent image is performed by radiating the photoconductor drum with light emitted from the plurality of EL elements 14.

The developing unit 161 is a drum having four developing devices 163Y, 163C, 163M, and 163K arranged at angular intervals of 90°, and is rotatable around a shaft 161a in the counterclockwise direction. The developing devices 163Y, 163C, 163M, and 163K respectively supply yellow, cyan, magenta, and black toners to the photoconductor drum 165 to deposit the toners as developing agents on an electrostatic latent image, thereby forming a toner image, i.e., a visible image on the photosensitive drum 165.

The endless intermediate transfer belt 169 is wound around a driving roller 170a, a driven roller 170b, a primary transfer roller 166, and a tension roller, and rotates around these rollers in a direction as indicated by arrow. The primary transfer roller 166 electrostatically attracts the toner image from the photoconductor drum 165 and transfers the toner image to the intermediate transfer belt 169 passing between this photoconductor drum and the primary transfer roller 166.

More specifically, during the first one turn of the photoconductor drum 165, an electrostatic latent image for a yellow (Y) image is written by the exposure head 167, a toner image with the same color is formed by the developing device 163Y, and the toner image is then transferred onto the intermediate transfer belt 169. During the next turn of the photoconductor drum, an electrostatic latent image for a cyan (C) image is written by the exposure head 167, a toner image with the same color is formed by the developing device 163C, and the toner image is then transferred onto the intermediate transfer belt 169 so as to be superposed on the yellow toner image. While the photoconductor drum 165 makes four turns in this way, yellow, cyan, magenta, and black toner images are sequentially superposed on the intermediate transfer belt 169. As a result, a full-color toner image is formed on the intermediate transfer belt 169. When images are formed on both sides of a sheet on which the images are to be finally formed, a full-color toner image is formed on the intermediate transfer belt 169 in such a manner that toner images with the same color are transferred onto the front and rear surfaces of the intermediate transfer belt 169, and then toner images with the next same color are transferred onto the front and rear surfaces of the intermediate transfer belt 169.

A sheet conveying path 174 is formed in the image printing apparatus to allow a sheet to pass therethrough. A sheet is picked up one by one by a pickup roller 179 from a sheet feed cassette 178, is conveyed by a conveying roller along the sheet conveying path 174, and passes through a nip between the intermediate transfer belt 169 abutting on the driving roller 170a and the secondary transfer roller 171. The secondary transfer roller 171 electrostatically attracts a full-color toner image collectively from the intermediate transfer belt 169 to transfer the toner image onto one surface of the sheet. The secondary transfer roller 171 is adapted to approach and be separated from the intermediate transfer belt 169 by a clutch (not shown). When a full-color toner image is transferred onto a sheet, the secondary transfer roller 171 is brought into contact with the intermediate transfer belt 169. When a toner image is superposed on the intermediate transfer belt 169, the secondary transfer roller 171 is separated from the intermediate transfer belt 169.

The sheet having the toner image transferred thereonto in this manner is conveyed to the fixing unit 172, and then passes between a heating roller 172a and a pressure roller 172b of the fixing unit 172, so that the toner image is fixed to the sheet. The sheet after the fixing process passes through a pair of sheet discharge rollers 176 to advance in a direction indicated by an arrow F. In a case of double-sided printing, after most of the sheet has passed between the pair of sheet discharge rollers 176, the pair of sheet discharge rollers 176 are rotated in a reverse direction so that the sheet is introduced into a conveying path 175 for double-sided printing, as indicated by an arrow G. Then, the toner image is transferred onto the other surface of the sheet by the secondary transfer roller 171, and the fixing unit 172 performs the fixing process on the toner image again. Then, the sheet is discharged by the pair of sheet discharge rollers 176.

Since the above-mentioned image printing apparatus uses the above-mentioned organic EL panel as the exposure head 167, it is possible to meet demands for a reduction in the size of the exposure head. In addition, since the quality of light emitted from the organic EL panel is hardly deteriorated, it is easy to keep display quality for a long time.

Although the image printing apparatus has been described as an example of the electronic apparatus including the organic EL device according to the invention, the organic EL device according to the invention can also be applied to other electrophotographic image printing apparatuses, such as an image printing apparatus that directly transfers a toner image onto a sheet from a photoconductor drum without using an intermediate transfer belt, an image printing apparatus that forms a monochromatic image, and an image printing apparatus that uses a photoconductor as an image carrier.

What is claimed is:

1. A light-emitting device comprising:
   a substrate;
   a light-emitting element which is arranged above the substrate and which has an anode, a cathode, and an organic light-emitting layer interposed therebetween;
   a first gas barrier layer that is formed of an inorganic compound and covers a region larger than a region in which the light-emitting element is arranged; and
   a second gas barrier layer that is formed of an inorganic compound and covers a region larger than the region in which the light-emitting element is arranged, the second gas barrier layer is disposed on the first gas barrier layer, wherein a region in which the first barrier layer is disposed is not matched with a region in which the second barrier layer is disposed.

2. The light-emitting device according to claim 1, wherein the region in which the first barrier layer is disposed is larger than the region in which the second barrier layer is disposed.

3. The light-emitting device according to claim 1, further comprising:
   an organic buffer layer that is disposed between the first gas barrier layer and the cathode,
   a region in which the organic buffer layer is disposed is larger than a region in which the cathode is disposed.

4. The light-emitting device according to claim 1, further comprising:
   a first organic buffer layer and a second organic buffer layer that are disposed between the first gas barrier layer and the cathode, the second organic buffer layer is disposed on the first organic buffer layer,
   wherein a region in which the first organic buffer layer is disposed is not matched with a region in which the second organic buffer layer is disposed.

5. An electronic apparatus comprising the light-emitting device according to claim 1.

* * * * *